US010032877B2

(12) United States Patent
Chang et al.

(10) Patent No.: US 10,032,877 B2
(45) Date of Patent: Jul. 24, 2018

(54) FINFET AND METHOD OF FORMING SAME

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/611,531

(22) Filed: Jun. 1, 2017

(65) Prior Publication Data

US 2018/0040703 A1 Feb. 8, 2018

Related U.S. Application Data

(60) Provisional application No. 62/370,123, filed on Aug. 2, 2016, provisional application No. 62/405,705, filed on Oct. 7, 2016.

(51) Int. Cl.
| | | |
|---|---|---|
| *H01L 21/00* | (2006.01) |
| *H01L 21/336* | (2006.01) |
| *H01L 21/302* | (2006.01) |
| *H01L 27/148* | (2006.01) |
| *H01L 29/76* | (2006.01) |
| *H01L 29/417* | (2006.01) |
| *H01L 29/78* | (2006.01) |
| *H01L 29/06* | (2006.01) |
| *H01L 29/66* | (2006.01) |

(Continued)

(52) U.S. Cl.
CPC .......... *H01L 29/41791* (2013.01); *H01L 21/823431* (2013.01); *H01L 21/823821* (2013.01); *H01L 29/0603* (2013.01); *H01L 29/6681* (2013.01); *H01L 29/66545* (2013.01); *H01L 29/66583* (2013.01); *H01L 29/785* (2013.01)

(58) Field of Classification Search
CPC ..... H01L 21/823431; H01L 21/823821; H01L 21/823487; H01L 21/823885; H01L 27/10876; H01L 27/10823; H01L 27/0886; H01L 27/0924; H01L 27/10841; H01L 29/41791; H01L 29/66621; H01L 29/66348; H01L 29/66545; H01L 29/785; H01L 29/7395
USPC ....... 438/156, 173, 192, 212, 268, 734–738; 257/220, 263, 328, 330, 331
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

*Primary Examiner* — Hsien Ming Lee
(74) *Attorney, Agent, or Firm* — Slater Matsil, LLP

(57) ABSTRACT

A FinFET device and a method of forming the same are provided. A method includes forming a patterned mask stack over a substrate, features of the patterned mask stack protecting the substrate having a uniform width. Unprotected portions of the substrate exposed by the patterned mask stack are removed to form a plurality of recesses in the substrate, unremoved portions of the substrate interposed between adjacent recesses forming a plurality of fins. Portions of the plurality of fins are removed, a width of a first fin of the plurality of fins being less than a width of a second fin of the plurality of fins.

20 Claims, 30 Drawing Sheets

(51) Int. Cl.
   *H01L 21/8234*  (2006.01)
   *H01L 21/8238*  (2006.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,455,176 B2 * | 9/2016 | Tsao .................... H01L 29/0653 |
| 9,520,482 B1 | 12/2016 | Chang et al. |
| 9,576,814 B2 | 2/2017 | Wu et al. |
| 2016/0247731 A1 * | 8/2016 | Balakrishnan ...... H01L 21/3083 |
| 2017/0148681 A1 * | 5/2017 | Basker ............ H01L 21/823412 |

* cited by examiner

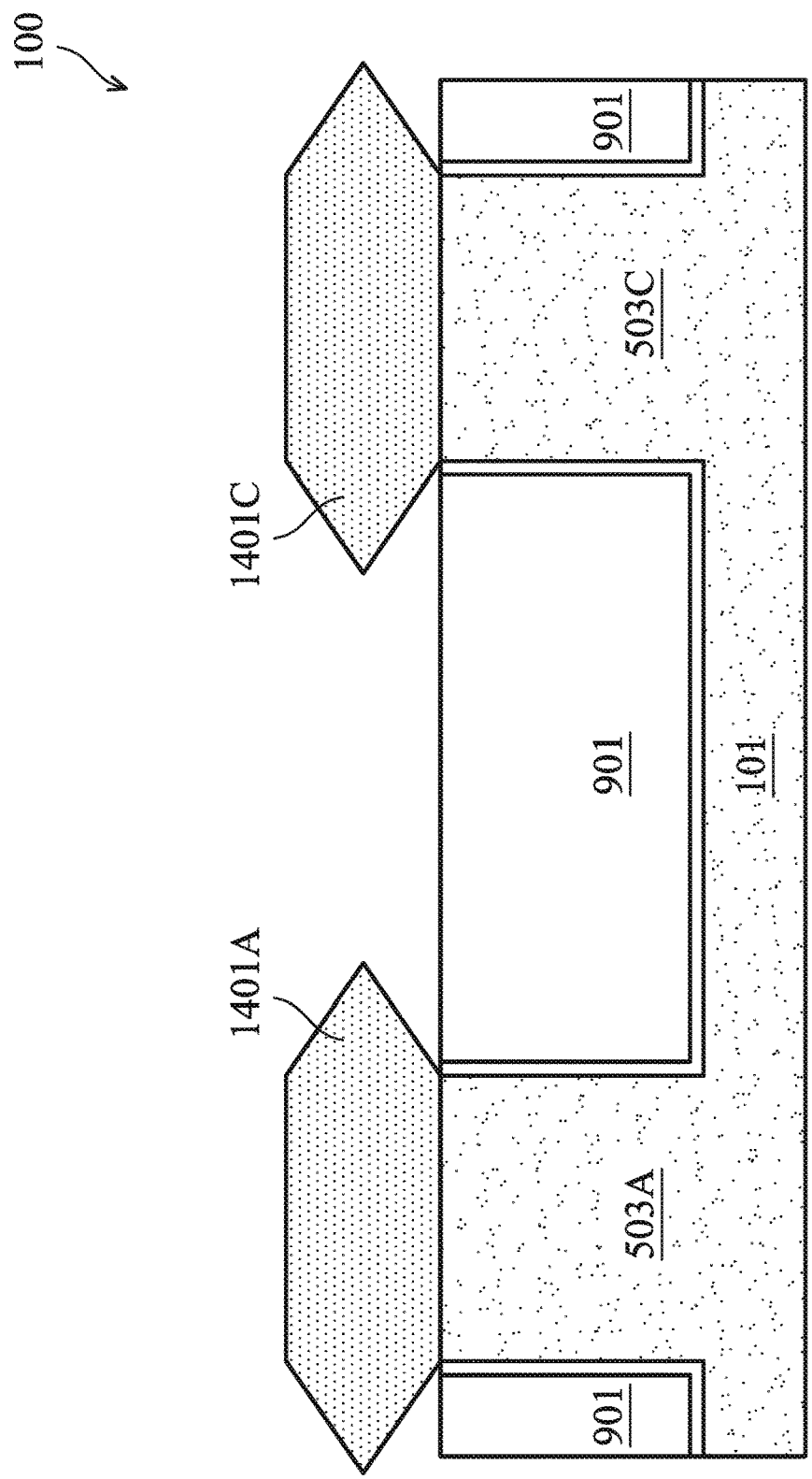

(12) United States Patent
US 10,032,877 B2

FINFET AND METHOD OF FORMING SAME

PRIORITY CLAIM AND CROSS-REFERENCE

This application claims the benefit of U.S. Provisional Application Ser. No. 62/370,123, filed on Aug. 2, 2016, entitled "Fin Structure and Method of Forming Same," and U.S. Provisional Application Ser. No. 62/405,705, filed on Oct. 7, 2016, entitled "FinFET and Method of Forming Same," which applications are hereby incorporated herein by reference in their entireties.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is used often in semiconductor devices. There may be a large number of transistors (e.g. hundreds of, thousands of, or millions of transistors) on a single integrated circuit (IC), for example. A common type of transistor used in semiconductor device fabrication is a metal oxide semiconductor field effect transistor (MOSFET), as an example. A planar transistor (e.g. planar MOSFET) typically includes a gate dielectric disposed over a channel region in a substrate, and a gate electrode formed over the gate dielectric. A source region and a drain region of the transistor are formed on either side of the channel region.

Multiple gate field-effect transistors (MuGFETs) are a recent development in semiconductor technology. One type of MuGFET is referred to as a fin field-effect transistor (FinFET), which is a transistor structure that includes a fin-shaped semiconductor material that is raised vertically out of the semiconductor surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
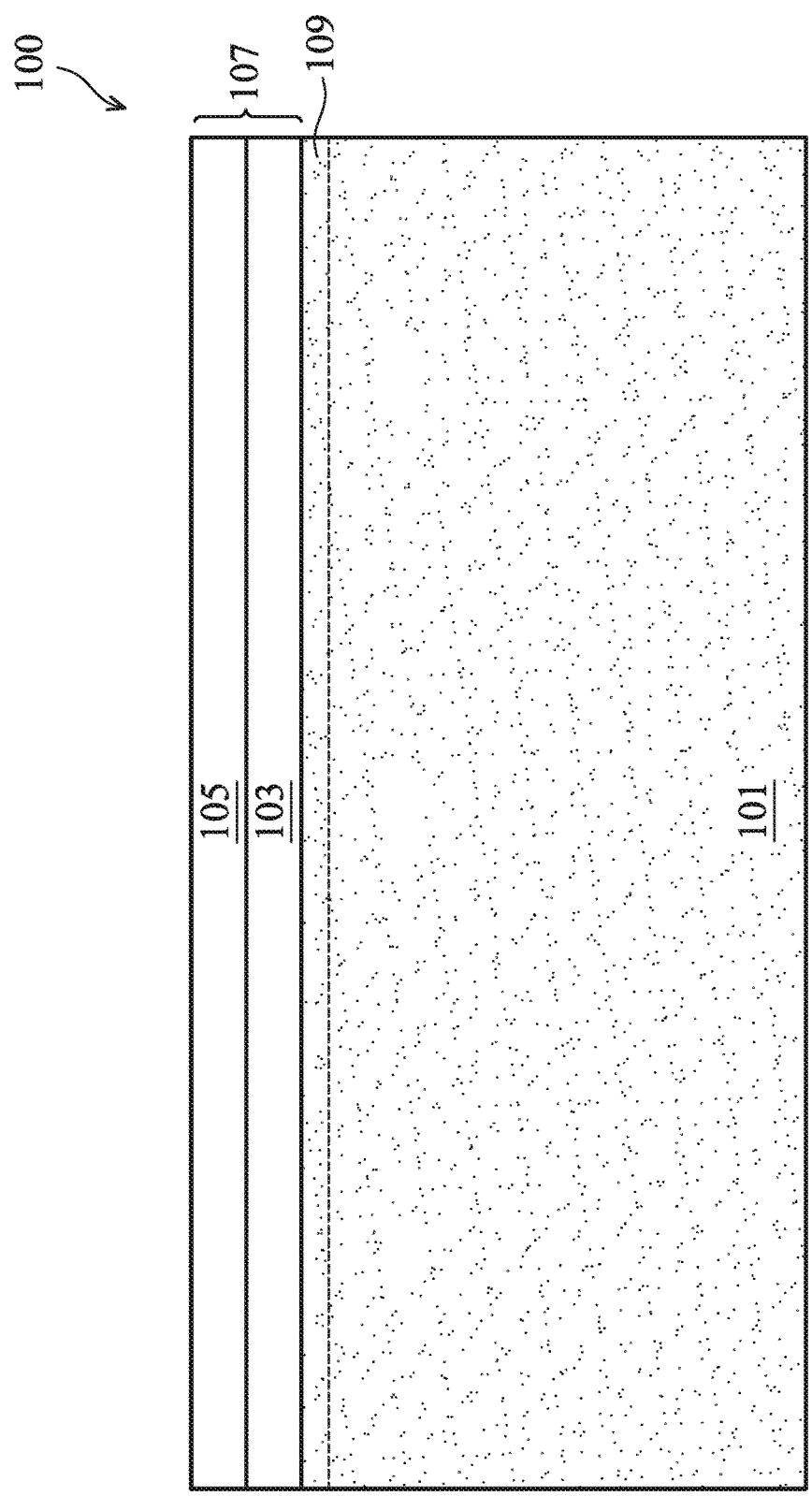
FIGS. 1-15C illustrate cross-sectional views of various intermediate stages of fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a fin structure and a method of forming the same. In some embodiments, a fin structure may be used to form a semiconductor device such as a fin field-effect transistor (FinFET). Various embodiments described herein allow for enlarging a fin loop bending window, source/drain epitaxy uniformity control, large source/drain contact landing window, lower contact resistance, better wafer acceptance test (WAT) and reliability performance, and better circuit probe (CP) yield performance.

FIGS. 1-15C illustrate cross-sectional views of various intermediate stages of fabrication of a semiconductor device 100 in accordance with some embodiments. FIG. 1 illustrates a cross-sectional view of a substrate 101, which may be a part of a wafer. The substrate 101 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 101 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 101 to generate the structural and functional requirements of the design for the semiconductor device 100. The integrated circuit devices may be formed using any suitable methods. In some embodiments, a top surface of the substrate 101 may be covered by a native oxide layer 109. Alternatively, the top surface of the substrate 101 may be free from the native oxide layer 109. In such embodiments, the native oxide layer 109 may be removed from the substrate 101 using a suitable cleaning process.

A mask layer 107 is formed over the substrate 101. In some embodiments, the mask layer 107 may be a multilayer mask and may also be referred to as a mask stack 107. In the illustrated embodiment, the mask stack 107 comprises a first mask layer 103 formed over the substrate 101 and a second mask layer 105 formed over the first mask layer 103. The first mask layer 103 may be a hard mask comprising an oxide, such as silicon oxide, or the like. The first mask layer 103 may also be referred to as a pad oxide. In some embodiments where the first mask layer 103 comprises silicon oxide and the substrate 101 comprises silicon, the first mask layer 103 may be formed by oxidizing a surface layer of the substrate 101. In other embodiments, the first mask layer 103 may be formed using Atomic Layer Deposition (ALD), Chemical Vapor Deposition (CVD), the like, or a combination thereof. In some embodiments, the first mask layer 103 may have a thickness between about 100 Å and about 1000 Å. It is appreciated that the values recited throughout the description are examples, and different values may also be adopted without changing the principle of the present disclosure.

The second mask layer 105 may be a hard mask comprising silicon nitride, silicon oxynitride, silicon carbide, silicon carbonitride, the like, or a combination thereof. In some embodiments where the second mask layer 105 comprises silicon nitride, the second mask layer 105 may be formed using thermal nitridation, plasma anodic nitridation, Low-Pressure Chemical Vapor Deposition (LPCVD), Plasma Enhanced Chemical Vapor Deposition (PECVD), the like, or a combination thereof. In some embodiments, the second mask layer 105 may have a thickness between about 200 Å and about 1000 Å.

Figure 2:
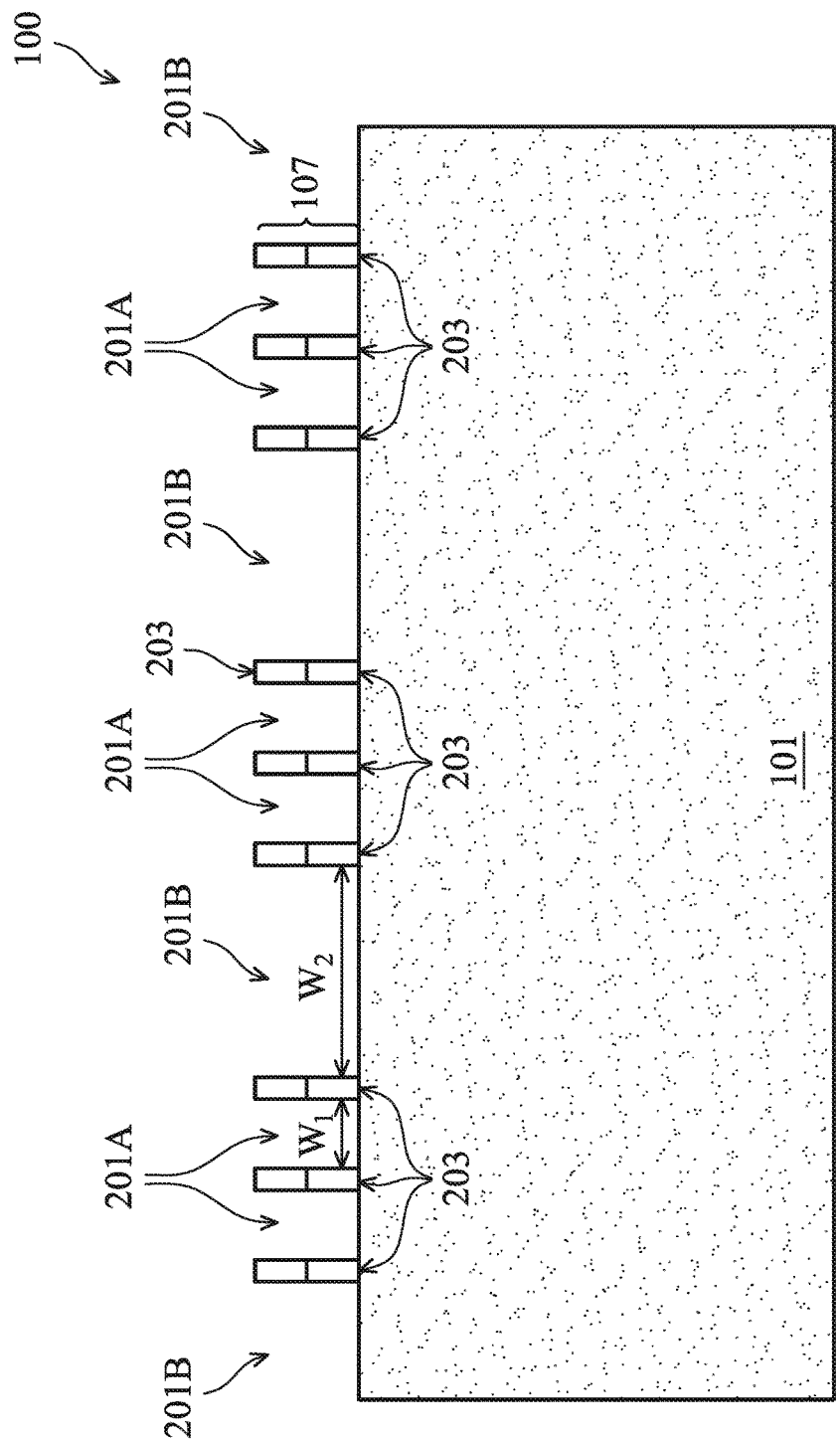

Referring to FIG. 2, the mask stack 107 is patterned to form openings 201A and 201B in the mask stack 107. The openings 201A and 201B expose portions of the substrate 101. In some embodiments, the openings 201A and 201B may have elongated portions with lengthwise directions parallel to each other as viewed from top. Furthermore, each or some of unremoved portions 203 of the mask stack 107 may be encircled by respective openings 201A and/or 201B as viewed from top. In some embodiments, the mask stack 107 may be patterned using suitable photolithography and etch processes. In other embodiments, the mask stack 107 may be patterned using a multiple-patterning process, such as a self-aligned double patterning (SADP) process, a self-aligned quadruple patterning (SAQP) process, or the like, that allows for forming features having a reduced critical dimension (CD) and pitch. In such embodiments, one or more additional mask layers, one or more mandrel layers, and one or more spacer layers (not shown) may be formed over the mask stack 107. The one or more additional mask layers, the one or more mandrel layers, and the one or more spacer layers may be patterned to form desired patterns, which are then transferred to the mask stack 107. The patterns of the openings 201A and 201B and the patterns of the unremoved portions 203 of the mask stack 107 as shown in FIG. 2 are provided for illustration only. In other embodiments, the patterns of the openings 201A and 201B and the patterns of the unremoved portions 203 of the mask stack 107 may be altered according to design requirements of the semiconductor device 100. In the illustrated embodiment, all of the unremoved portions 203 of the mask stack 107 have a same width. Alternatively, the unremoved portions 203 of the mask stack 107 may have different widths. In some embodiments, a width $W_1$ of the openings 201A is less than a width $W_2$ of the openings 201B. As described below in greater detail, different widths of the openings 201A and 201B are used to form crown-shaped fin structures (see FIG. 5) in the substrate 101. In some embodiments, the width $W_1$ of the openings 201A may be between about 5 nm and about 50 nm. In some embodiments, the width $W_2$ of the openings 201B may be between about 10 nm and about 100 nm.

Figure 3A:
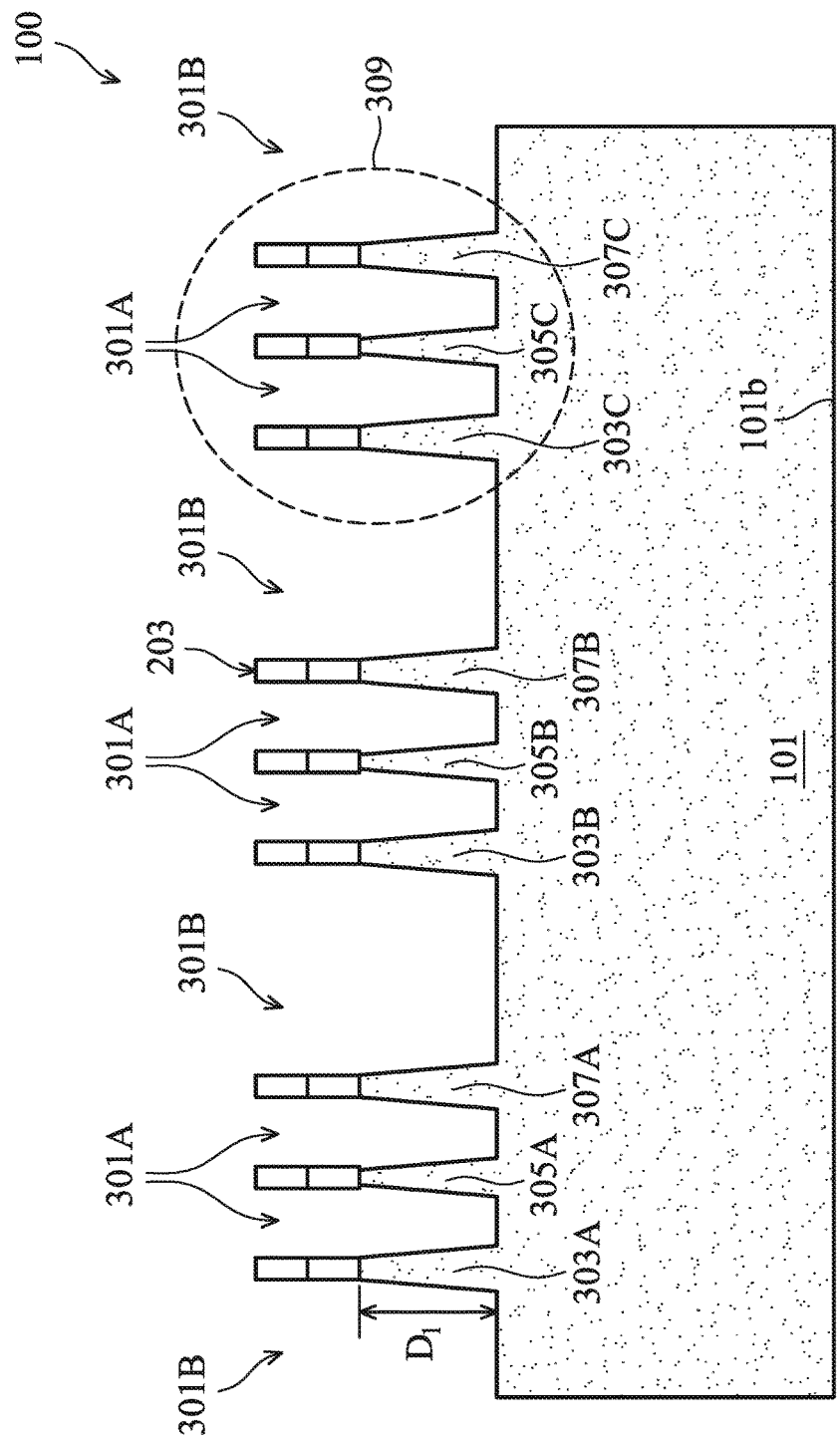
Figure 3B:
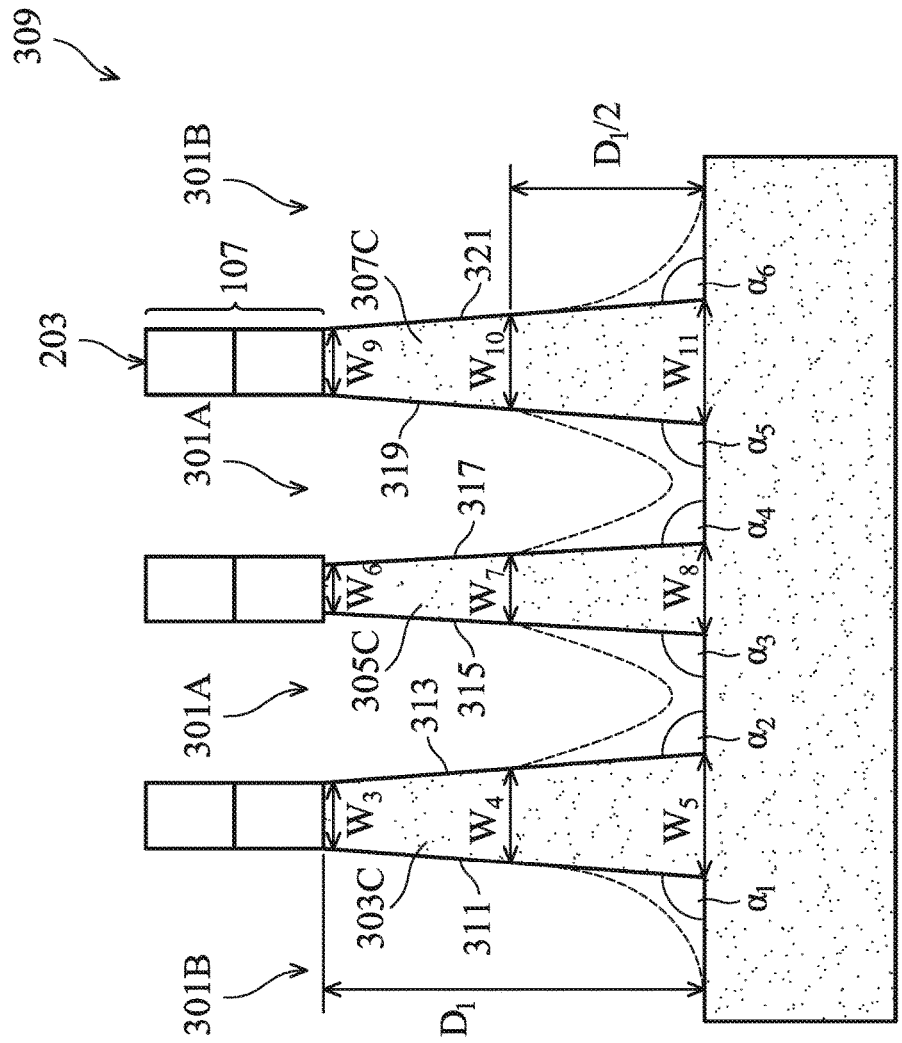

Referring to FIGS. 3A and 3B, the substrate 101 is patterned to form openings 301A and 301B in the substrate 101, where FIG. 3B illustrates a magnified view of a portion 309 of the semiconductor device 100. The openings 301A correspond to respective openings 201A in the mask stack 107 (see FIG. 2), and the openings 301B correspond to respective openings 201B in the mask stack 107 (see FIG. 2). The openings 301A may have a similar pattern as the openings 201A as viewed from top, and the openings 301B may have a similar pattern as the openings 201B as viewed from top. In some embodiments, a width of the openings 301B may be greater than a width of the openings 301A. A depth $D_1$ of the openings 301A and 301B may be between about 5 nm and about 500 nm. Strips of a semiconductor material of the substrate 101 interposed between adjacent ones of the openings 301A and 301B form a group of fins 303A, 305A and 307A, a group of fins 303B, 305B and 307B, and a group of fins 303C, 305C and 307C. In some embodiments, adjacent ones of the fins 303A, 305A and 307A are separated by respective openings 301A, adjacent ones of the fins 303B, 305B and 307B are separated by respective openings 301A, and adjacent ones of the fins 303C, 305C and 307C are separated by respective openings 301A. Furthermore, the group of fins 303A, 305A and 307A is separated from the group of fins 303B, 305B and 307B by a respective opening 301B, and the group of fins 303B, 305B and 307B is separated from the group of fins 303C, 305C and 307C by a respective opening 301B.

FIG. 3B illustrates a magnified view of a portion 309 (as indicated in FIG. 3A) of the semiconductor device 100 showing the group of fins 303C, 305C, and 307C. In the illustrated embodiment, a width $W_3$ of a top portion of the fin 303C is less than a width $W_4$ of a middle portion of the fin 303C, and the width $W_4$ of the middle portion of the fin 303C is less than a width $W_5$ of a bottom portion of the fin 303C. Alternatively, the width $W_3$ may approximately equal to the widths $W_4$ and $W_5$. In some embodiments, the width $W_3$ may be between about 1 nm and about 50 nm, such as between about 3 nm and about 8 nm. In some embodiments, the width $W_4$ may be between about 1 nm and about 50 nm, such as between about 5 nm and about 10 nm. In some embodiments, the width $W_5$ may be between about 1 nm and about 50 nm, such as between about 7 nm and about 15 nm. Similarly, a width $W_6$ of a top portion of the fin 305C is less than a width $W_7$ of a middle portion of the fin 305C, and the width $W_7$ of the middle portion of the fin 305C is less than a width $W_8$ of a bottom portion of the fin 305C. Alternatively, the width $W_6$ may approximately equal to the widths $W_7$ and $W_8$. In some embodiments, the width $W_6$ may be between about 1 nm and about 50 nm, such as between about 1 nm and about 5 nm. In some embodiments, the width $W_7$ may be between about 1 nm and about 50 nm, such as between about 2 nm and about 8 nm. In some embodiments, the width $W_8$ may be between about 1 nm and about 50 nm, such as between about 7 nm and about 12 nm. Furthermore, a width $W_9$ of a top portion of the fin 307C is less than a width $W_{10}$ of a middle portion of the fin 307C, and the width $W_{10}$ of the middle portion of the fin 307C is less than a width $W_{11}$ of a bottom portion of the fin 307C. Alternatively, the width $W_9$ may approximately equal to the widths $W_{10}$ and $W_{11}$. In some embodiments, the width $W_9$ may be between about 1 nm and about 50 nm, such as between about 3 nm and about 8 nm. In some embodiments, the width $W_{10}$ may be between about 1 nm and about 50 nm, such as between about 5 nm and about 10 nm. In some embodiments, the width $W_{11}$ may be between about 1 nm and about 50 nm, such as between about 7 nm and about 15 nm. Embodiments having dimensions as described above allow for a fin loop bending window enlargement, source/drain epitaxy uniformity control, large source/drain contact landing window, lower contact resistance, better wafer acceptance test (WAT) and reliability performance, and better circuit probe (CP) yield performance.

The fin 303C has a first sidewall 311 and the second sidewall 313 opposite the first sidewall 311, such that the first sidewall 311 forms an angle $\alpha_1$ with a surface parallel to a bottom surface 101b of the substrate 101 and the second sidewall 313 forms an angle $\alpha_2$ with a surface parallel to the bottom surface 101b of the substrate 101. In the illustrated embodiment, the angle $\alpha_1$ is greater than the angle $\alpha_2$. The fin 305C has a first sidewall 315 and the second sidewall 317 opposite the first sidewall 315, such that the first sidewall 315 forms an angle $\alpha_3$ with a surface parallel to the bottom surface 101b of the substrate 101 and the second sidewall 317 forms an angle $\alpha_4$ with a surface parallel to the bottom surface 101b of the substrate 101. In the illustrated embodiment, the angle $\alpha_3$ is approximately equal to the angle $\alpha_4$. The fin 307C has a first sidewall 319 and a second sidewall 321 opposite the first sidewall 319, such that the first sidewall 319 forms an angle $\alpha_5$ with a surface parallel to the bottom surface 101b of the substrate 101 and the second sidewall 321 forms an angle $\alpha_6$ with a surface parallel to the bottom surface 101b of the substrate 101. In the illustrated embodiment, the angle $\alpha_5$ is less than the angle $\alpha_6$. In addition, the angles $\alpha_3$ and $\alpha_4$ may be less than angles $\alpha_5$ and/or $\alpha_6$, and the angles $\alpha_3$ and $\alpha_4$ may be approximately equal to the angles $\alpha_2$ and/or $\alpha_5$. In some embodiments, the angle $\alpha_1$ may be between about 90° and about 130°. In some embodiments, the angle $\alpha_2$ may be between about 90° and about 110°. In some embodiments, the angle $\alpha_3$ may be between about 90° and about 115°. In some embodiments, the angle $\alpha_4$ may be between about 90° and about 115°. In some embodiments, the angle $\alpha_5$ may be between about 90° and about 110°. In some embodiments, the angle $\alpha_6$ may be between about 90° and about 130°. Furthermore, dimensions of the fins 303A and 303B may be approximately equal to dimensions of the fin 303C, dimensions of the fins 305A and 305B may be approximately equal to dimensions of the fin 305C, and dimensions of the fins 307A and 307B may be approximately equal to dimensions of the fin 307C.

Referring further to FIG. 3B, in the illustrated embodiment, the unremoved portions 203 of the mask stack 107 have a same width, such that the width of the unremoved portions 203 of the mask stack 107 is equal to the critical dimension (CD), which is the smallest width that is achievable by the patterning process of the mask stack 107. However, the fin 305C is thinner than the fins 303C and 307C. As described in greater detail below, the substrate 101 is etched by using the unremoved portions 203 of the mask stack 107 as an etch mask, and the fin 305C is etched faster than the fins 303C and 307C due to proximity of the fins 303C and 307C to the fin 305C. Accordingly, a width of the top portion of the fin 305C may be less than the width of the unremoved portions 203 of the mask stack 107, while the widths of the top portions of the fins 303C and 307C may be approximately equal to the width of the unremoved portions 203 of the mask stack 107. Accordingly, in such embodiments, the width of the fin 305C may be less than the CD, while the widths of the fins 303C and 307C may be approximately equal to the CD. In the illustrated embodiment, the width $W_6$ is less than the widths $W_3$ and $W_9$, the width $W_7$ is less than the widths $W_4$ and $W_{10}$, and the width $W_8$ is less than the widths $W_5$ and $W_{11}$. As described below in greater detail, ratios $W_6/W_3$, $W_6/W_9$, $W_7/W_4$, $W_7/W_{10}$, $W_8/W_5$, and $W_8/W_{11}$ may be tuned by appropriately changing parameters of the patterning process for forming the fins 303A, 303B, 303C, 305A, 305B, 305C, 307A, 307B and 307C. In some embodiments, the ratios $W_6/W_3$, $W_6/W_9$, $W_7/W_4$, $W_7/W_{10}$, $W_8/W_5$, and $W_8/W_{11}$ may be between about 0.1 and about 1. Furthermore, by appropriately changing parameters of the patterning process for forming the fins 303A, 303B, 303C, 305A, 305B, 305C, 307A, 307B and 307C, the angles $\alpha_6$, $\alpha_2$, $\alpha_3$, $\alpha_4$, $\alpha_5$, and $\alpha_6$ may be tuned to a desired value according to specifications of a resulting FinFET. In alternative embodiments where the fins 303C, 305C and 307C having widths greater than the CD is desired, the mask stack 107 is patterned such that a width of the unremoved portion 203 corresponding to the fin 305C is less than widths of the of the unremoved portions 203 corresponding to the fins 303C and 307C, with the width of the unremoved portion 203 corresponding to the fin 305C being greater than the CD.

Referring further to FIGS. 3A and 3B, the substrate 101 may be patterned by one or more suitable etch processes to form the openings 301A and 301B while using the unremoved portions 203 of the mask stack 107 as an etch mask. The one or more suitable etch processes may include an anisotropic dry etch process, or the like. In some embodiments where the top surface of the substrate 101 is covered by the native oxide layer 109 (not shown in FIGS. 3A and 3B, see FIG. 1), the one or more suitable etch process may include a first etch process to pattern the native oxide layer 109. The first etch process may also be referred to as a breakthrough (BT) etch process. In some embodiments where the substrate 101 is formed of silicon and the native oxide layer 109 is formed of silicon oxide, the BT etch process is a reactive ion etch (RIE) process with etch process gases including $CHF_3$, Ar, $CF_4$, $N_2$, $O_2$, $CH_2F_2$, $SF_3$, the like, or a combination thereof. The RIE process may be performed for an etch time $t_{BT}$ between about 2 sec and about 20 sec, at a pressure between about 2 mTorr and about 30 mTorr, a temperature between about 10° C. and about 100° C., a radio frequency (RF) power between about 100 W than about 1500 W, and a voltage bias between about 10 V and about 800 V.

In some embodiments, after the BT etch process, if used, a second etch process is performed to pattern the substrate 101 and to form the openings 301A and 301B. The second etch process may also referred to as a main etch (ME) process. In some embodiments where the substrate 101 is formed of silicon, the ME process is a RIE process with etch process gases including $N_2$, $NH_3$, HF, Ar, HBr, $O_2$, $CH_xF_y$, the like, or a combination thereof. The RIE process may be performed for an etch time $t_{ME}$ between about 10 sec and about 200 sec, at a pressure between about 0 mTorr and about 2000 mTorr, and a temperature between about 30° C. and about 200° C., an RF power between about 100 W than about 800 W, and a voltage bias between about 50 V and about 600 V.

In some embodiments, the width $W_1$ of the openings 201A of the patterned mask stack 107 (see FIG. 2) is selected such that distances between adjacent fins within each group of fins (such as distances within the group of fin 303A, 305A and 307A, distances within the group of fin 303B, 305B and 307B, and distances within the group of fin 303C, 305C and 307C) is small enough to incur proximity effect between the fins in the same group. Due to proximity effect, the fins 305A, 305B and 305C are etched faster than the fins 303A, 303B, 303C, 307A, 307B and 307C. Furthermore, the RF power of the RIE process may be increased to increase the strength of plasma and increase a thickness difference between the fin 305A and fins 303A/307A, a thickness difference between the fin 305B and fins 303B/307B, and a thickness difference between the fin 305C and fins 303C/307C. Accordingly, the fin 305A is thinner than the fins 303A/307A, the fin 305B is thinner than the fins 303B/307B, and the fin 305C is thinner than the fins 303C/307C.

In some embodiment, the ME process may be performed using a first mixture of etch process gases, with the first mixture of etch process gases comprising the etch process gases such that the chemical etch rate of the substrate 101 is greater than the bombardment etch rate of the substrate 101. The desired ratio of the chemical etch rate and the bombardment etch rate may be achieved by including lesser amount of chemically inert etch process gases (such as, for example, $N_2$, Ar, or the like) in the first mixture compared to chemically active etch process gases (such as, for example, $NH_3$, HF, HBr, $O_2$, or the like). Furthermore, since the chemical etch is more isotopic that the bombardment etch, the anisotropy of the ME process may be tuned by varying amounts of chemically inert gases with respect to chemically active gases. In some embodiments, by including lesser amount of chemically inert etch process gases in the first mixture compared to chemically active etch process gases, a ratio of a lateral etch rate (in a direction parallel to the bottom surface 101b of the substrate 101) over a vertical etch rate (in a direction perpendicular to the bottom surface 101b of the substrate 101) may be tuned to be close to 1. Accordingly, the anisotropy of the ME process may be reduced. In some embodiments, the anisotropy of the ME process may be also reduced by reducing the bias voltage that controls energy of ions participating in the bombardment etch. Due to reduced anisotropy of the ME process, sidewalls of the fins 303A, 303B, 303C, 305A, 305B, 305C, 307A, 307B may have smaller slopes than desired. The shapes of the fins 303C, 305C and 307C after the ME process are depicted by dashed lines in FIG. 3B. In some embodiments, the ratio of the lateral etch rate over the vertical etch rate for the ME process may be between about 0.3 and about 1.

In some embodiments, the second etch process (the ME process) may be followed by a third etch process to further change dimensions and shapes of the fins 303A, 303B, 303C, 305A, 305B, 305C, 307A, 307B. The third etch process may further etch the fins 303A, 303B, 303C, 305A, 305B, 305C, 307A, 307B and 307C to obtain desired ratios $W_6/W_3$, $W_6/W_9$, $W_7/W_4$, $W_7/W_{10}$, $W_8/W_5$, and $W_8/W_{11}$. Furthermore, the third etch process may improve planarity of the sidewalls of the fins 303A, 303B, 303C, 305A, 305B, 305C, 307A, 307B and 307C and may increase slopes of the sidewalls of the fins 303A, 303B, 303C, 305A, 305B, 305C, 307A, 307B and 307C by tuning the angles $\alpha_6$, $\alpha_2$, $\alpha_3$, $\alpha_4$, $\alpha_5$, and $\alpha_6$ to values closer to 90 degrees. By increasing the slopes of the sidewalls of the fins 303A, 303B, 303C, 305A, 305B, 305C, 307A, 307B and 307C, fin isolation characteristics may be improved. The third etch process may also be referred to as an over-etch (OE) process. In some embodiments where the substrate 101 is formed of silicon, the OE process is a RIE process with etch process gases including $N_2$, $NH_3$, HF, Ar, HBr, $O_2$, the like, or a combination thereof. The RIE process may be performed for an etch time $t_{OE}$ between about 10 sec and about 200 sec, at a pressure between about 0 mTorr and about 2000 mTorr, and a temperature between about 30° C. and about 200° C., an RF power between about 100 W than about 1000 W, and a voltage bias between about 30 V and about 500 V.

In some embodiment, the OE process may be performed using a second mixture of etch process gases, with the second mixture of etch process gases comprising the etch process gases such that the chemical etch rate of the substrate 101 is less than the bombardment etch rate of the substrate 101. The desired ratio of the chemical etch rate and the bombardment etch rate may be achieved by including greater amount of chemically inert etch process gases (such as, for example, $N_2$, Ar, or the like) in the second mixture compared to chemically active etch process gases (such as, for example, $NH_3$, HF, HBr, $O_2$, $CH_xF_y$, or the like). By including greater amount of chemically inert etch process gases in the second mixture to compared chemically active etch process gases, a ratio of a lateral etch rate (in a direction parallel to the bottom surface 101b of the substrate 101) over a vertical etch rate (in a direction perpendicular to the bottom surface 101b of the substrate 101) may be reduced. Accordingly, the anisotropy of the OE process may be increased. In some embodiments, the anisotropy of the OE process may be also increased by increasing the bias voltage that controls energy of ions participating in the bombardment etch. Accordingly, in some embodiments, the ME process is less anisotropic (or more isotropic) than the OE process. Due to greater anisotropy of the OE process compared to the ME process, the upper portions of the fins 303A, 303B, 303C, 305A, 305B, 305C, 307A, 307B and 307C may not be significantly etched, and widths of the upper portions of the fins 303A, 303B, 303C, 305A, 305B, 305C, 307A, 307B and 307C may not be significantly affected by the OE process. Accordingly, the ratios $W_6/W_3$, $W_6/W_9$ may not be significantly affected by the OE process. In some embodiments, the ratio of the lateral etch rate over the vertical etch rate for the OE process may be between about 0.3 and about 0.8.

In some embodiments, the ratios $W_6/W_3$, $W_6/W_9$, $W_7/W_4$, $W_7/W_{10}$, $W_8/W_5$, and $W_8/W_{11}$ and the angles $\alpha_6$, $\alpha_2$, $\alpha_3$, $\alpha_4$, $\alpha_5$, and $\alpha_6$ may be further tuned by tuning various process parameters of the ME process and the OE process. For example, the ME process and the OE process may be performed using different mixtures of etch process gases, different temperatures, different pressures, different RF powers, different bias voltages and/or different etch times to obtain the desired ratios $W_6/W_3$, $W_6/W_9$, $W_7/W_4$, $W_7/W_{10}$, $W_8/W_5$, and $W_8/W_{11}$ and the desired values for the angles $\alpha_6$, $\alpha_2$, $\alpha_3$, $\alpha_4$, $\alpha_5$, and $\alpha_6$ may be obtained. In some embodiments, the ME process may be performed at a temperature between about 30° C. and about 120° C., and the OE process may be performed at a temperature between about 100° C. and about 200° C. In other embodiments, the ME process and the OE etch may be performed for different etch times, with an over-etch ratio $t_{OE}/t_{ME}$ being between 0.1 and about 0.3.

Figure 4:
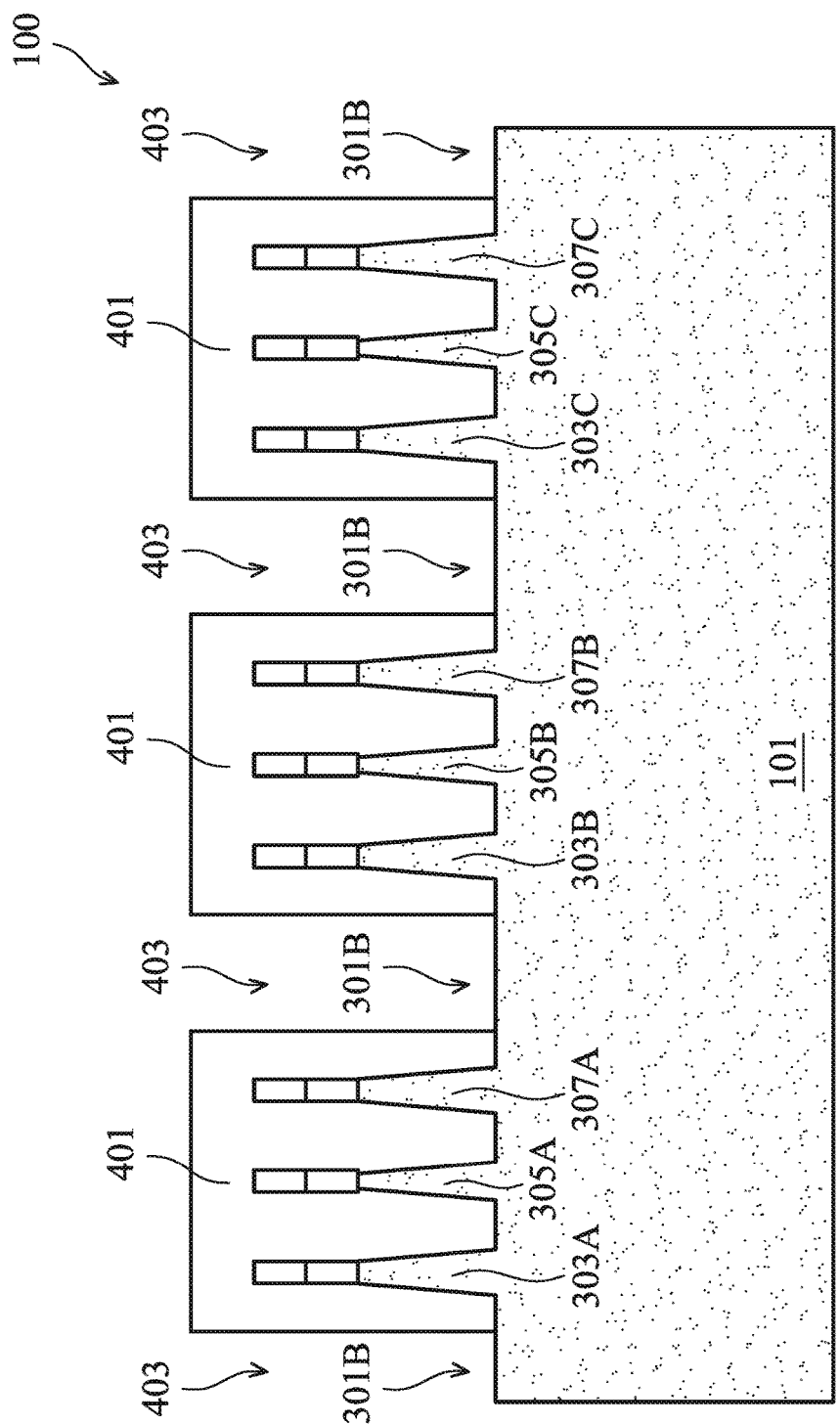

Referring to FIG. 4, a third mask layer 401 is formed over the substrate 101 and the fins 303A, 303B, 303C, 305A, 305B, 305C, 307A, 307B and 307C. The third mask layer 401 may comprise a photo-patternable material such as a photoresist material, and may be formed using a spin-on coating method, or the like. Alternatively, the third mask layer 401 may comprise a non-photo-patternable material. In yet other embodiments, the third mask layer 401 may comprise a multi-layer mask formed of layers of photo-patternable and non-photo-patternable materials. The third mask layer 401 is patterned to form openings 403 in the third mask layer 401. In some embodiments where the third mask layer 401 comprises a photoresist material, the photoresist material is irradiated (exposed) and developed to remove portions of the photoresist material and form the openings 403. The openings 403 expose portions of bottoms of the openings 301B. In some embodiments, a width of the openings 403 is less than the width of the openings 301B. In some embodiments, the openings 403 may have elongated portions with lengthwise directions parallel to each other as viewed from top. Furthermore, the lengthwise directions of the openings 403 may be parallel to the lengthwise directions of the openings 201A and 201B (see FIG. 2), and the openings 301A and 301B (see FIG. 3).

Figure 5:
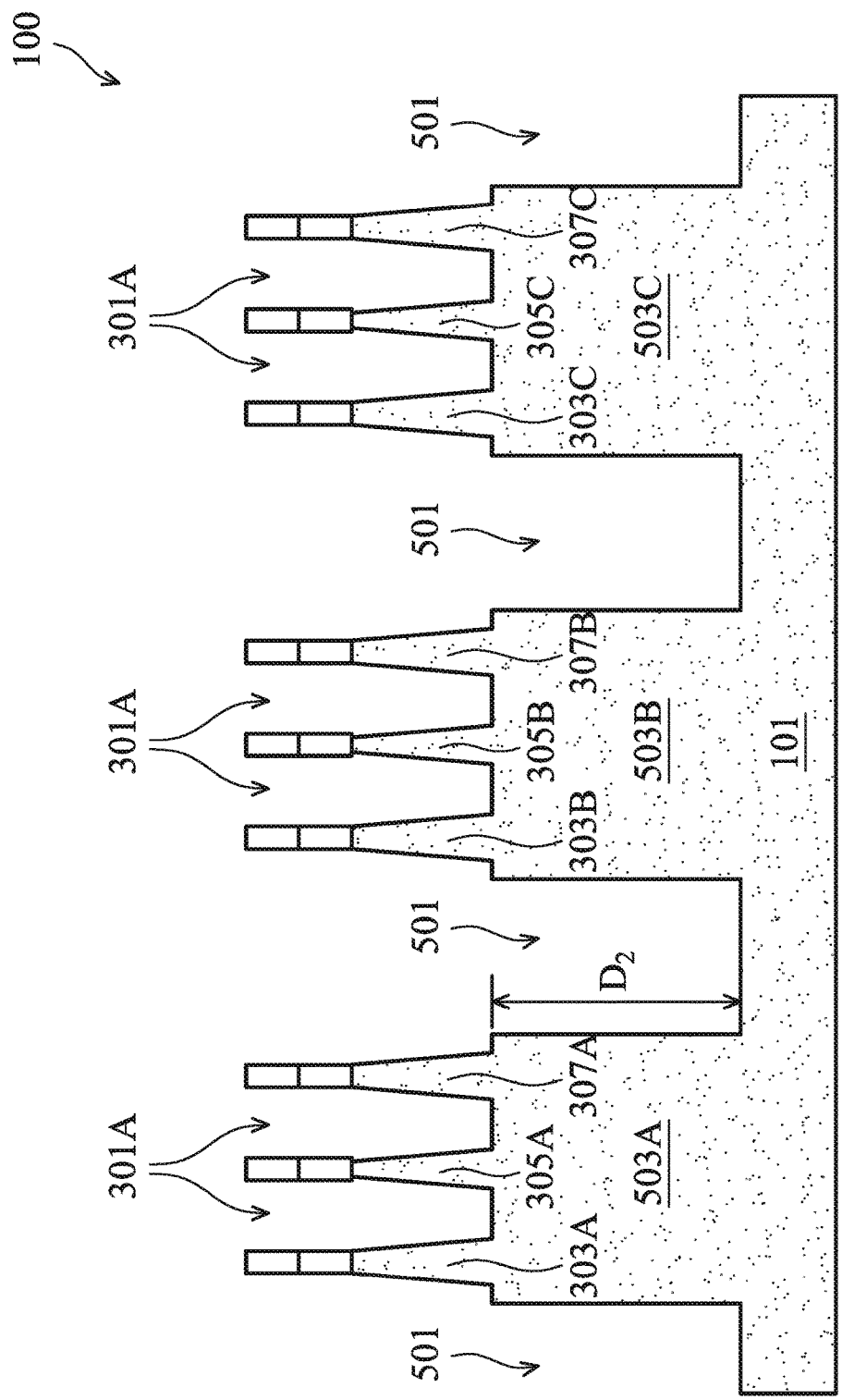

Referring to FIG. 5, the substrate 101 is patterned to form openings 501 in the substrate 101. The openings 501 correspond to respective openings 403 in the third mask layer 401 (see FIG. 4). The openings 501 may have a similar pattern as the openings 403 as viewed from top. In some embodiments, a width of the openings 501 may be approximately equal to the width of the openings 403. A depth $D_2$ of the openings 501 may be between about 20 nm and about 200 nm. Bottoms of the openings 501 are lower than bottoms of the openings 301A. The patterning process further forms a base 503A for fins 303A, 305A, and 307A, a base 503B for fins 303B, 305B, and 307B, and a base 503C for fins 303C, 305C, and 307C. Each of the bases 503A, 503B, and 503C is interposed between respective adjacent openings 501. In the illustrated embodiment, the group of fins 303A, 305A and 307A with the corresponding base 503A, the group of fins 303B, 305B and 307B with the corresponding base 503B, and the group of fins 303C, 305C and 307C with the corresponding base 503C have a shape of a crown. Accordingly, such structures may also be referred to as crown-shaped fin structures. In the illustrated embodiment, each crown-shaped structure comprises three fins. Alternatively, each crown-shaped structure may comprise less than or more than three fins, depending on the designed drive currents of the resulting FinFETs.

In some embodiments, the substrate 101 may be patterned by a suitable etch process using the third mask layer 401 (see FIG. 4) as an etch mask. The suitable etch process may include an anisotropic dry etch process, or the like. In some embodiments where the substrate 101 is formed of silicon, the substrate 101 is patterned by a RIE process with etch process gases including $N_2$, $CH_2F_2$, $CF_4$, $CHF_3$, $CH_3F$, HBr, $NF_3$, Ar, He, $Cl_2$, $CH_3F$, $SiCl_4$, the like, or a combination thereof. The RIE process may be performed for an etch time between about 50 sec and about 500 sec, at a pressure between about 3 mTorr and about 50 mTorr, a temperature between about 30° C. and 80° C., an RF power between about 100 W than about 1500 W, and a bias voltage between about 50 V and about 1000 V. During the patterning process, the third mask layer 401 may be partially consumed. The remaining third mask layer 401 is then removed. In some embodiments where the third mask layer 401 is formed of a photoresist material, the remaining third mask layer 401 may be removed using, for example, an ashing process followed by a wet clean process.

Referring further to FIG. 5, not all of the fins 303A, 303B, 303C, 305A, 305B, 305C, 307A, 307B, and 307C are active fins and are used to form FinFETs. In some embodiments, the fins 303A, 305A, 307A, 303C, 305C, and 307C are active fins, while the fins 303B, 305B and 307B are dummy fins and are not used for forming active FinFETs. Accordingly, the fins 303B, 305B and 307B and the corresponding base 503B may be also referred to as the dummy fins 303B, 305B and 307B and the dummy base 503B, respectively. As described below in greater detail, the dummy fins 303B, 305B and 307B and the dummy base 503B are removed. In the illustrated embodiments, two active fin structures (such as the active fins 303A, 305A and 307A with the corresponding active base 503A, and the active fins 303C, 305C and 307C with the corresponding active base 503C) and one dummy fin structure (such as the dummy fins 303B, 305B and 307B with the corresponding dummy base 503B) are shown. In other embodiments, a plurality of active fin structures and a plurality of dummy fin structures may be formed on the substrate 101, such that each dummy fin structure is interposed between respective adjacent active fin structures. In the illustrated embodiment, the active fin structures and the dummy fin structures are portions of the initial substrate 101. In other embodiments, the active fin structures and the dummy fin structures may be formed on the substrate by, for example, epitaxially growing a suitable semiconducting material on the substrate 101.

Figure 6:
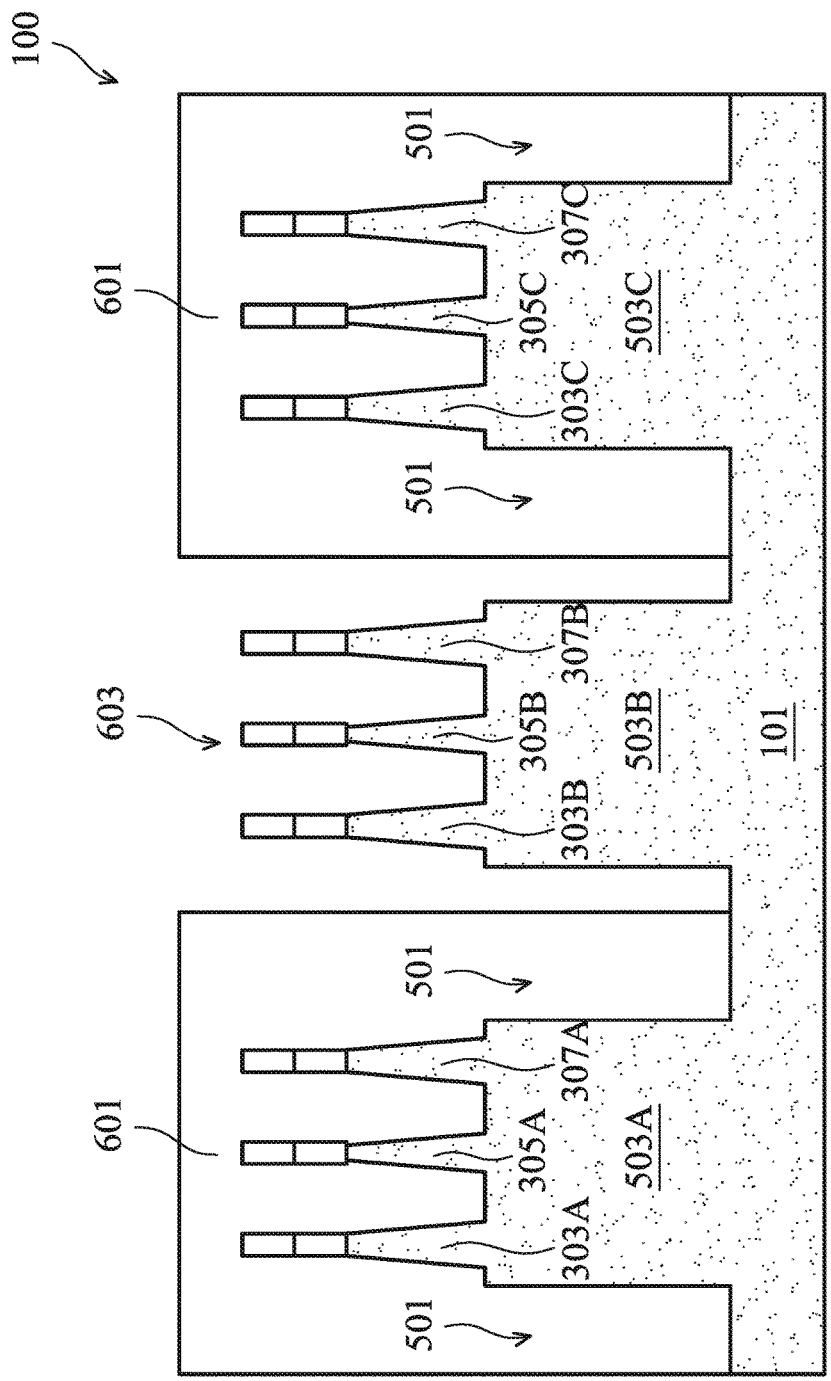

Referring to FIG. 6, a fourth mask layer 601 is formed over the substrate 101 and the fins 303A, 303B, 303C, 305A, 305B, 305C, 307A, 307B, and 307C. In some embodiments, the fourth mask layer 601 may be formed using similar materials and methods as the third mask layer 401, described above with reference to FIG. 4, and the description is not repeated herein for the sake of brevity. The fourth mask layer 601 is patterned to form an opening 603 in the fourth mask layer 601. In some embodiments, the fourth mask layer 601 may be patterned using similar methods as the third mask layer 401, described above with reference to FIG. 4, and the description is not repeated herein for the sake of brevity. The opening 603 exposes the dummy fins 303B, 305B and 307B and the corresponding dummy base 503B. In some embodiments, a width of the opening 603 may be approximately equal to or greater than a width of the dummy base 503B.

Figure 7:
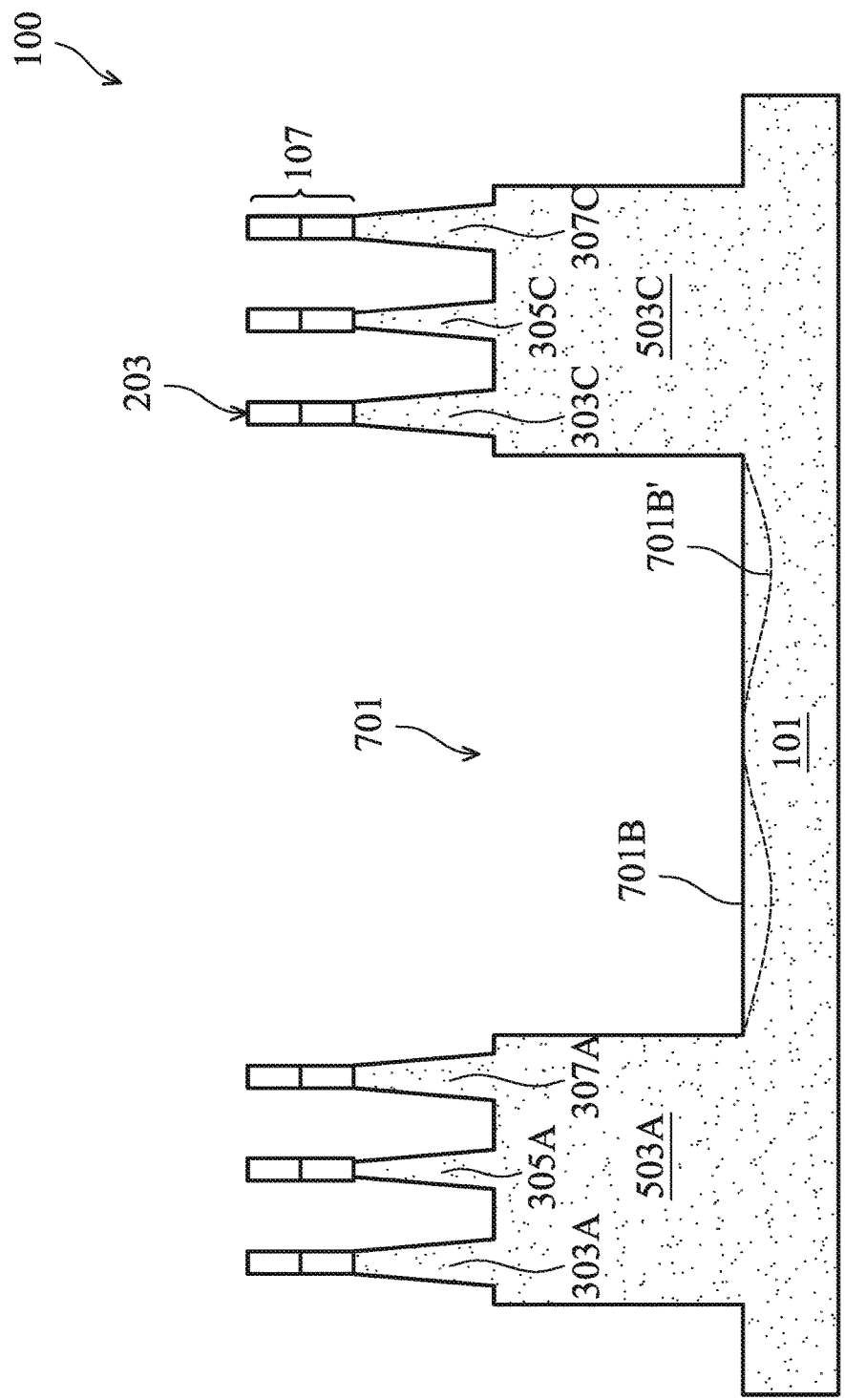

Referring to FIG. 7, the dummy fins 303B, 305B and 307B (see FIG. 6) and the corresponding dummy base 503B (see FIG. 6) are removed to form an opening 701 separating the active fins 303A, 305A and 307A with the corresponding active base 503A, and the active fins 303C, 305C and 307C with the corresponding active base 503C. In some embodiments, the dummy fins 303B, 305B and 307B and the corresponding dummy base 503B may be removed by a suitable etch process using the fourth mask layer 601 (see FIG. 6) as an etch mask. The suitable etch process may include an anisotropic wet etch process, an anisotropic dry etch process, a combination thereof, or the like. In some embodiments where the substrate 101 is formed of silicon, the dummy fins 303B, 305B, and 307B and the corresponding dummy base 503B are removed by a RIE process with etch process gases including $N_2$, $CH_2F_2$, $CF_4$, $CHF_3$, $CH_3F$, HBr, $NF_3$, Ar, He, $Cl_2$, $CH_3F$, $SiCl_4$, the like, or a combination thereof. The RIE process may be performed for an etch time between about 10 sec and about 100 sec, at a pressure between about 3 mTorr and about 10 mTorr, a temperature between about 20° C. and 60° C., an RF power between about 100 W and 1000 W, and a bias voltage between about 20 V and about 500 V. During the etching process, the unremoved portions 203 of the mask stack 107 over the dummy fins 303B, 305B and 307B are exposed to etchants to expose the underlying dummy fins 303B, 305B and 307B. The exposed dummy fins 303B, 305B and 307B are then etched and the dummy base 503B is exposed. The dummy base 503B is then etched until dummy base 503B is fully removed.

In some embodiments, depending on the etching process recipe, a bottom of the opening 701 may have different structures and shapes. In some embodiments, the bottom surface 701B may be a planar surface. In other embodiments, two, three, or more divots and protrusions may be formed at the bottom of the opening 701 such that the bottom surface 701B' is a non-planar surface. In such embodiments, the protrusions may be generated directly underlying and vertically aligned to the removed dummy fins 303B, 305B and 307B (see FIG. 6), with the number of protrusions equal to the number of the dummy fins. Alternatively, the divots are generated directly underlying and vertically aligned to the removed dummy fins 303B, 305B and 307B, with the number of divots equal to the number of the dummy fins. In yet other embodiments, the number of divots and/or the number of protrusions may be different from the number of the dummy fins.

Referring further to FIG. 7, during the etching process to remove the dummy fins 303B, 305B and 307B and the dummy base 503B, the fourth mask layer 601 (see FIG. 6) may be partially consumed. The remaining fourth mask layer 601 is then removed. In some embodiments where the fourth mask layer 601 is formed of a photoresist material, the remaining fourth mask layer 601 may be removed using, for example, an ashing process followed by a wet clean process.

Figure 8:
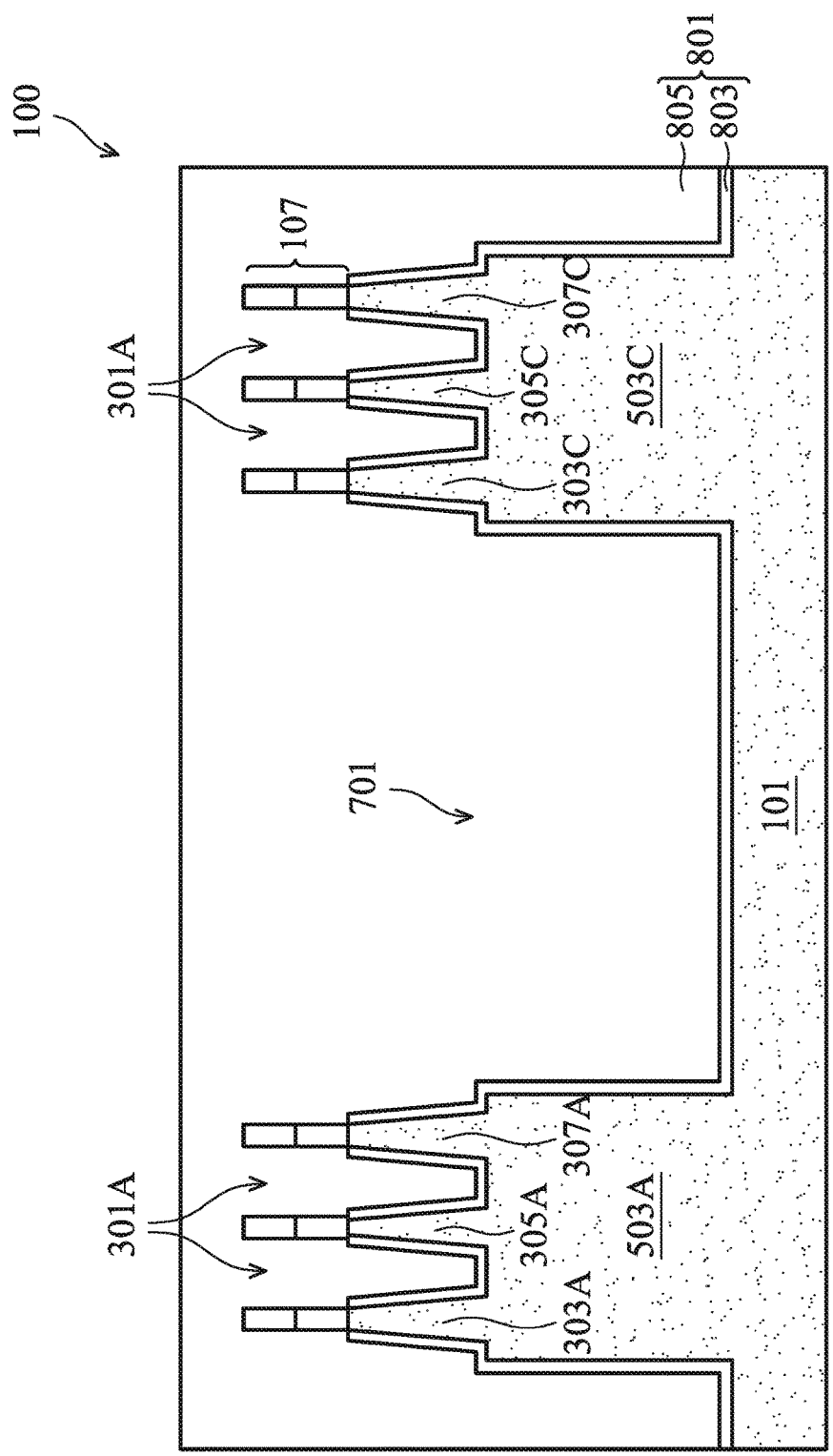

Referring to FIG. 8, a dielectric material 801 is formed over the substrate 101 to fill the openings 301A and 701. In some embodiments, the dielectric material 801 includes a liner 803 and a dielectric material 805 over the liner 803. The liner 803 may be formed as a conformal layer, whose horizontal portions and vertical portions have thicknesses close to each other. The thickness of the liner 803 may be between about 10 Å and about 100 Å.

In some embodiments, the liner 803 is formed by oxidizing exposed surfaces of the substrate 101, the active fins 303A, 305A, 307A, 303C, 305C and 307C, and the active bases 503A and 503C in an oxygen-containing environment, for example, through Local Oxidation of Silicon (LOCOS), wherein oxygen ($O_2$) may be included in the respective process gas. In other embodiments, the liner 803 may be formed using, for example, In-Situ Steam Generation (ISSG) with water steam or a combined gas of hydrogen ($H_2$) and oxygen ($O_2$) used to oxidize the exposed surfaces of the substrate 101, the active fins 303A, 305A, 307A, 303C, 305C and 307C, and the active bases 503A and 503C. The ISSG oxidation may be performed at an elevated temperature. In yet other embodiments, the liner 803 is formed using a deposition technique, such as ALD, CVD, Sub Atmospheric Chemical Vapor Deposition (SACVD), or the like, or a combination thereof.

The dielectric material 805 is then formed to fill the remaining portions of the openings 301A and 701. The dielectric material 805 may overfill the openings 301A and 701, such that a portion of the dielectric material 805 extends above a top surface of the patterned mask stack 107. In some embodiments, the dielectric material 805 may comprise silicon oxide, silicon carbide, silicon nitride, the like, or a combination thereof, and may be formed using Flowable Chemical Vapor Deposition (FCVD), spin-on coating, CVD, ALD, High-Density Plasma Chemical Vapor Deposition (HDPCVD), LPCVD, the like, or a combination thereof. In some embodiments where FCVD is used to form the dielectric material 805, a silicon- and nitrogen-containing precursor (for example, trisilylamine (TSA) or disilylamine (DSA)) is used, and hence the resulting dielectric material 805 is flowable (jelly-like). In other embodiments, the flowable dielectric material 805 is formed using an alkylamino silane based precursor. During the deposition of the dielectric material 805, plasma is turned on to activate the gaseous precursors for forming the flowable oxide. After dielectric material 805 is deposited, an anneal/curing step is performed, which converts flowable dielectric material 805 into a solid dielectric material. In some embodiments, an interface between the liner 803 and the dielectric material 805 may be distinguishable due to different material properties such as different types of materials and/or different densities. In other embodiments, the interface between the liner 803 and the dielectric material 805 may not be distinguishable.

Figure 9:
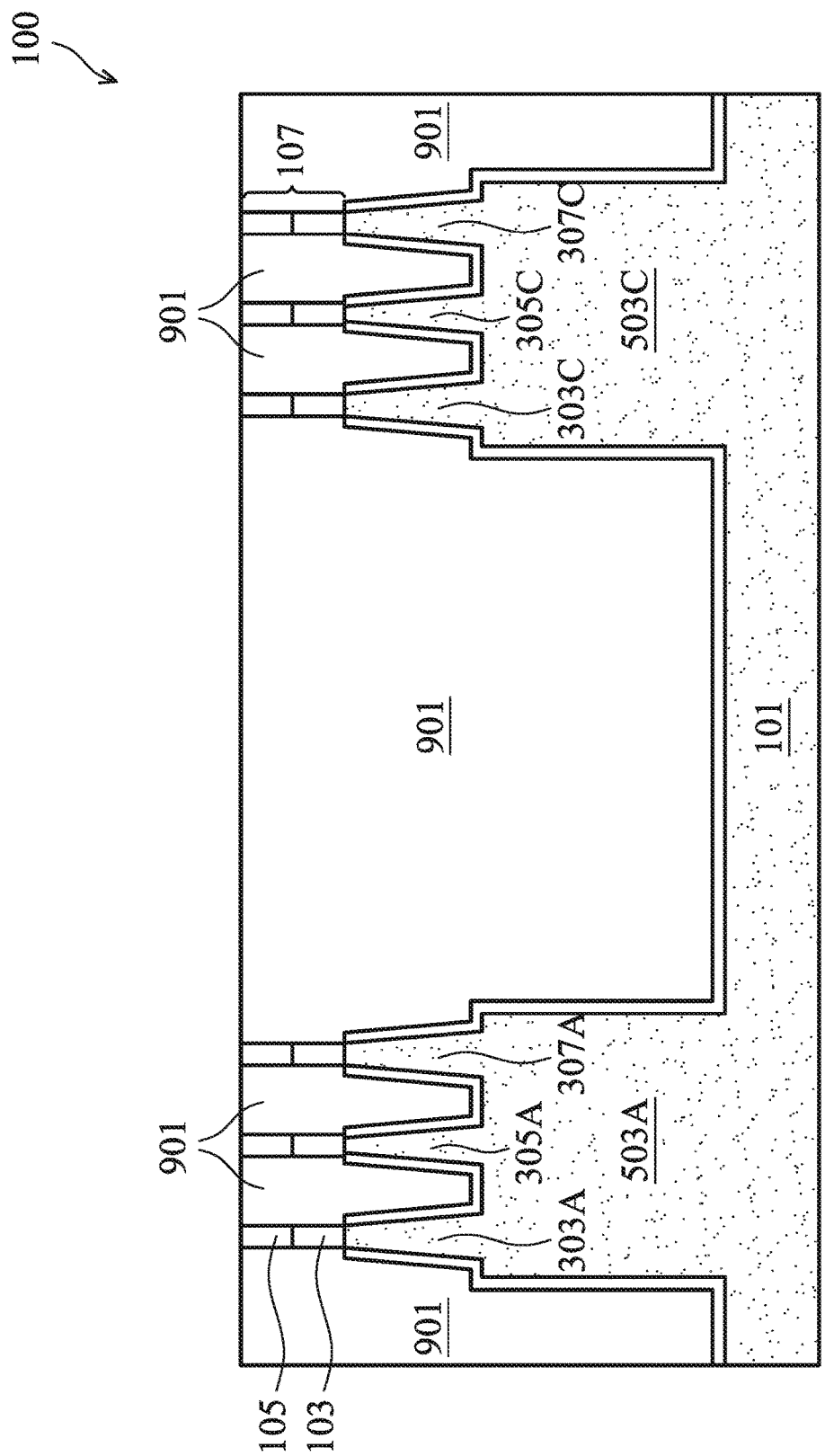

Referring to FIG. 9, the portions of the dielectric material 801 (see FIG. 8) extending over the top surface of the patterned mask stack 107 are removed. The remaining portions of the dielectric material 801 form isolation regions that may be also referred to as shallow trench isolation (STI) regions 901. In some embodiments, a chemical mechanical polishing (CMP) is performed to remove the portions of the dielectric material 801 extending over the top surface of the patterned mask stack 107. In such embodiments, the mask stack 107 may be used as a CMP stop layer, and hence the top surface of the mask stack 107 is substantially coplanar with top surfaces of the STI regions 901. In other embodiments, the portions of the dielectric material 801 extending over the top surface of the patterned mask stack 107 may be removed using grinding, etching, the like, or a combination thereof.

Figure 10A:
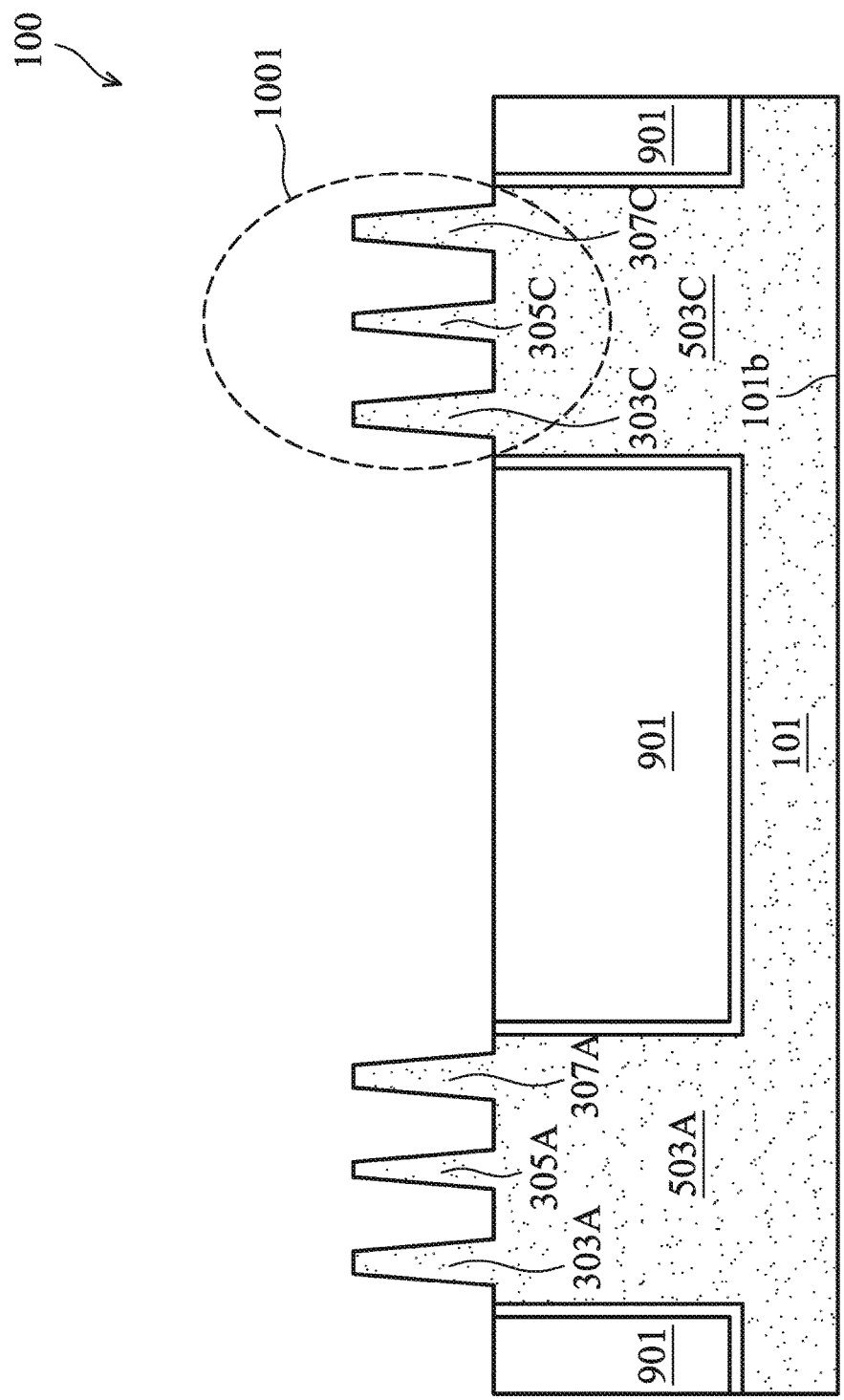

Referring to FIG. 10A, the patterned mask stack 107 is removed. In some embodiments where the first mask layer 103 comprises silicon oxide and the second mask layer 105 comprises silicon nitride, the second mask layer 105 may be removed in a wet process using hot phosphoric acid ($H_3PO_4$) as an etchant, and the first mask layer 103 may be removed in a wet process using buffered hydrofluoric acid (BHF) as an etchant. Subsequently, the STI regions 901 are recessed to expose sidewalls of the active fins 303A, 305A, 307A, 303C, 305C and 307C. The STI regions 901 may be recessed using an isotropic or anisotropic etching process, which may be a dry etch process or a wet etch process. In some embodiments, the STI regions 901 are recessed using a dry etch method, in which the process gases including $NH_3$ and $NF_3$ are used. In other embodiments, the STI regions 901 are recessed using a wet etch method, in which the etchant solution is a dilute HF solution, which may have an HF concentration lower than about 1 percent. In some embodiments wherein both the first mask layer 103 and the STI regions 901 are formed of silicon oxide, a same etching process may remove the first mask layer 103 and recess the STI regions 901. Subsequently, the active fins 303A, 305A, 307A, 303C, 305C and 307C may be cleaned using a wet clean process, for example.

After recessing the STI regions 901, the active fins 303A, 305A, 307A, 303C, 305C and 307C protrude over the top surfaces of STI regions 901. In some embodiments, the portions of STI regions 901 directly over the active bases 503A and 503C are fully removed, and the top surfaces of remaining STI regions 901 are substantially level with, or slightly lower than, top surfaces of the active bases 503A and 503C. In other embodiments, the portions of STI regions 901 directly over the active bases 503A and 503C are partially removed, and the top surfaces of remaining STI regions 901 are higher than the top surfaces of the active bases 503A and 503C.

Figure 10B:
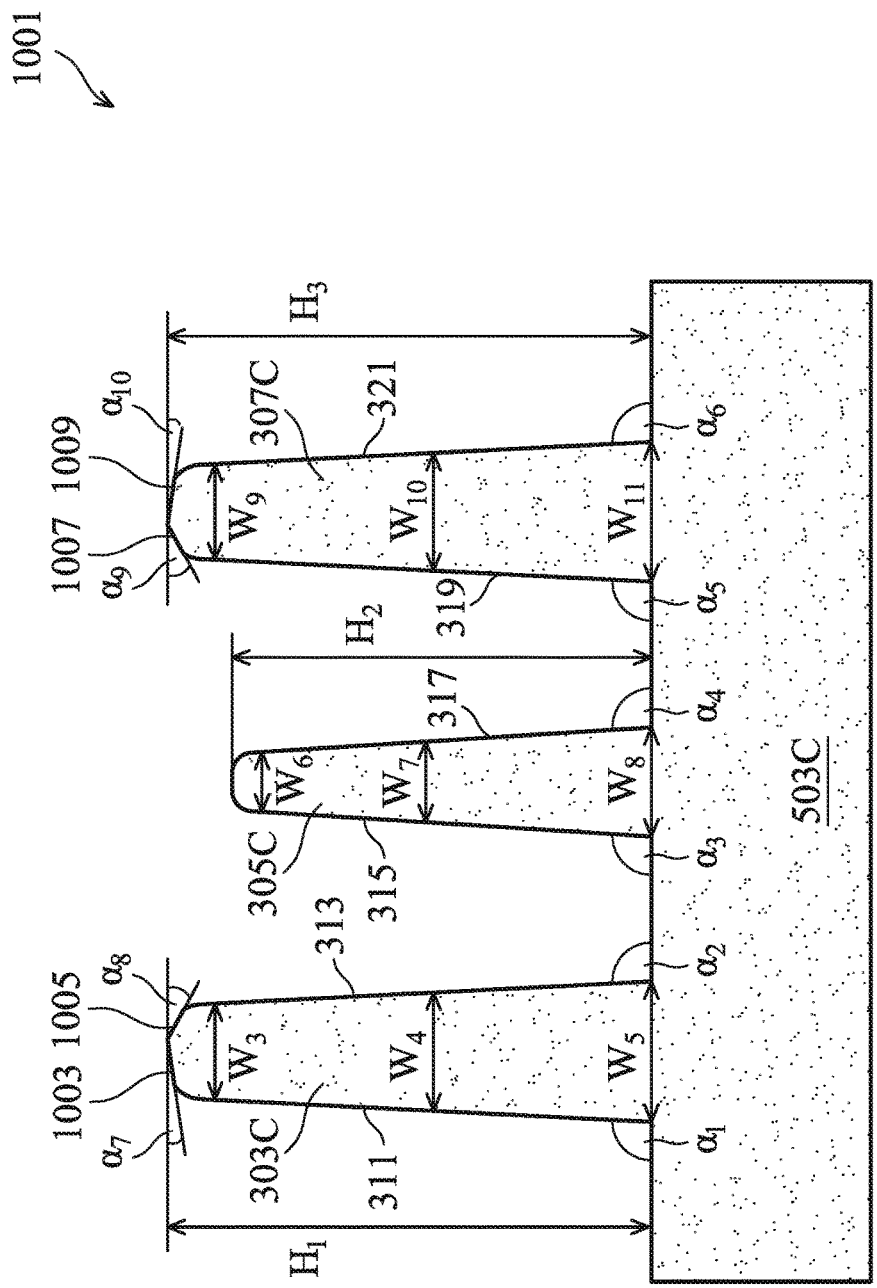

FIG. 10B illustrates a magnified view of a portion 1001 (as indicated in FIG. 10A) of the semiconductor device 100 showing the group of active fins 303C, 305C, and 307C. Various etch and clean processes described above with reference to FIG. 10A may further affect shapes and dimensions of the active fins 303C, 305C, and 307C. In some embodiments, heights of the active fins 303C, 305C, and 307C may be reduced. Since the active fin 305C is thinner than the active fins 303C and 307, the height of the active fin 305C is reduced by a greater amount than the active fins 303C and 307. Accordingly, a height $H_2$ of the active fin 305C is less than a height $H_1$ of the active fin 303C and/or a height $H_3$ of the active fin 307C. In the illustrated embodiment, the height $H_1$ of the active fin 303C is approximately equal to the height $H_3$ of the active fin 307C. In alternative embodiments, the height $H_1$ of the active fin 303C may be different from the height $H_3$ of the active fin 307C. In some embodiments, the height $H_1$ may be between about 2 nm and 5000 nm. In some embodiments, the height $H_2$ may be between about 2 nm and 5000 nm. In some embodiments, the height $H_3$ may be between about 2 nm and 5000 nm. In some embodiments, a difference between the height $H_1$ and the height $H_2$ may be between about 3 Å and about 100 Å. In some embodiments, a difference between the height $H_3$ and the height $H_2$ may be between about 3 Å and about 100 Å.

In some embodiments, top surface profiles of the active fins 303C and 307C are also affected by various etch and clean processes described above with reference to FIG. 10A. In the illustrated embodiment, a top surface of the active fin 303C has a first facet 1003 and a second facet 1005, such that the first facet 1003 forms an angle $\alpha_7$ with a surface parallel to the bottom surface 101b of the substrate 101 and the second facet 1005 forms an angle $\alpha_8$ with a surface parallel to the bottom surface 101b of the substrate 101. In the illustrated embodiment, the angle $\alpha_7$ is less than the angle $\alpha_8$. In some embodiments, the angle $\alpha_7$ may be between about 1° and about 10°. In some embodiments, the angle $\alpha_8$ may be between about 1° and about 10°. Similarly, the top surface of the active fin 307C has a first facet 1007 and a second facet 1009, such that the first facet 1007 forms an angle $\alpha_9$ with a surface parallel to the bottom surface 101b of the substrate 101 and the second facet 1009 forms an angle $\alpha_{10}$ with a surface parallel to the bottom surface 101b of the substrate 101. In the illustrated embodiment, the angle $\alpha_9$ is greater than the angle $\alpha_{10}$. In some embodiments, the angle $\alpha_9$ may be between about 1° and about 10°. In some embodiments, the angle $\alpha_{10}$ may be between about 1° and about 10°. Furthermore, dimensions and shapes of the active fin 303A may be approximately same as dimensions and shapes of the active fin 303C, dimensions and shapes of the active fin 305A may be approximately same as dimensions and shapes of the active fin 305C, and dimensions and shapes of the active fin 307A may be approximately same as dimensions and shapes of the active fin 307C.

Figure 10C:
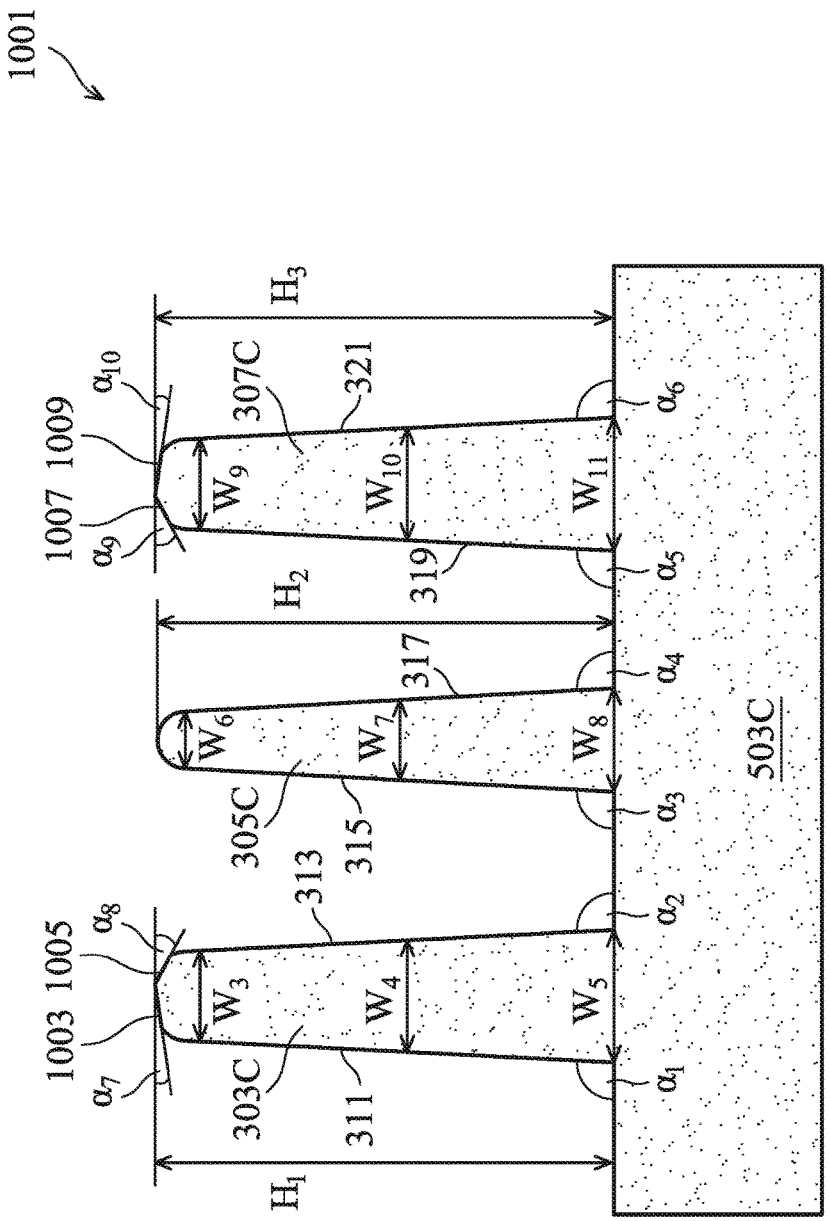

FIG. 10C illustrates a magnified view of a portion 1001 (as indicated in FIG. 10A) of the semiconductor device 100 showing the group of active fins 303C, 305C, and 307C in accordance with alternative embodiments. The structure of FIG. 10C is similar to the structure of FIG. 10B, with the like elements being labeled by like reference numerals, and the description is not repeated herein for the sake of brevity. In the illustrate embodiment, the height $H_2$ of the active fin 305C is approximately equal to the height $H_1$ of the active fin 303C and the height $H_3$ of the active fin 307C.

Figure 11:
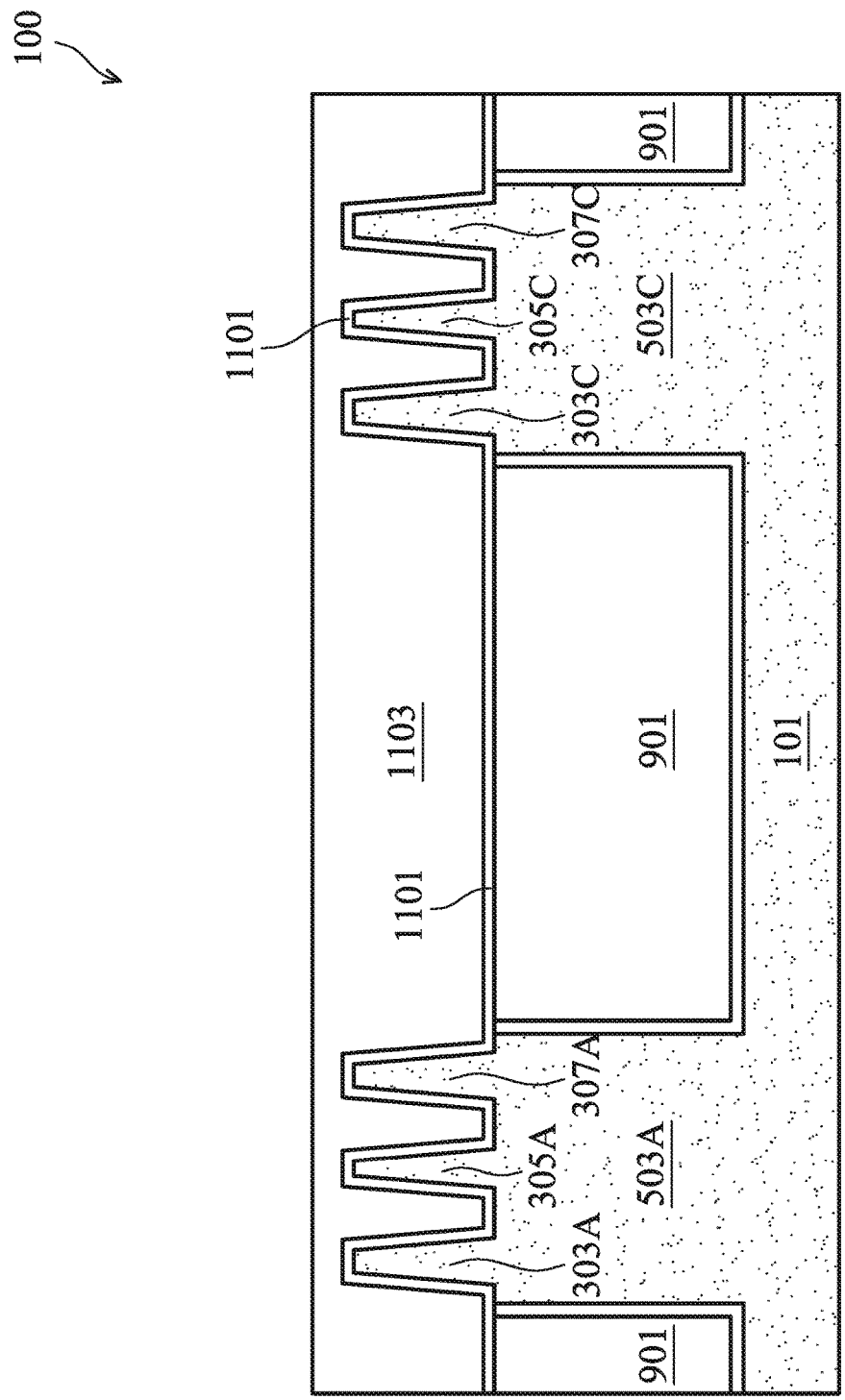

Referring to FIG. 11, a dummy gate dielectric 1101 is formed over the active fins 303A, 305A, 307A, 303C, 305C and 307C, and the STI regions 901, and a dummy gate electrode 1103 is formed over the dummy gate dielectric 1101. The dummy gate dielectric 1101 may comprise silicon oxide, or the like, and may be formed using oxidation, CVD, LPCD, the like, or a combination thereof. The dummy gate electrode 1103 may comprise polysilicon, or the like, and may be formed using CVD, LPCD, the like, or a combination thereof.

Figure 12A:
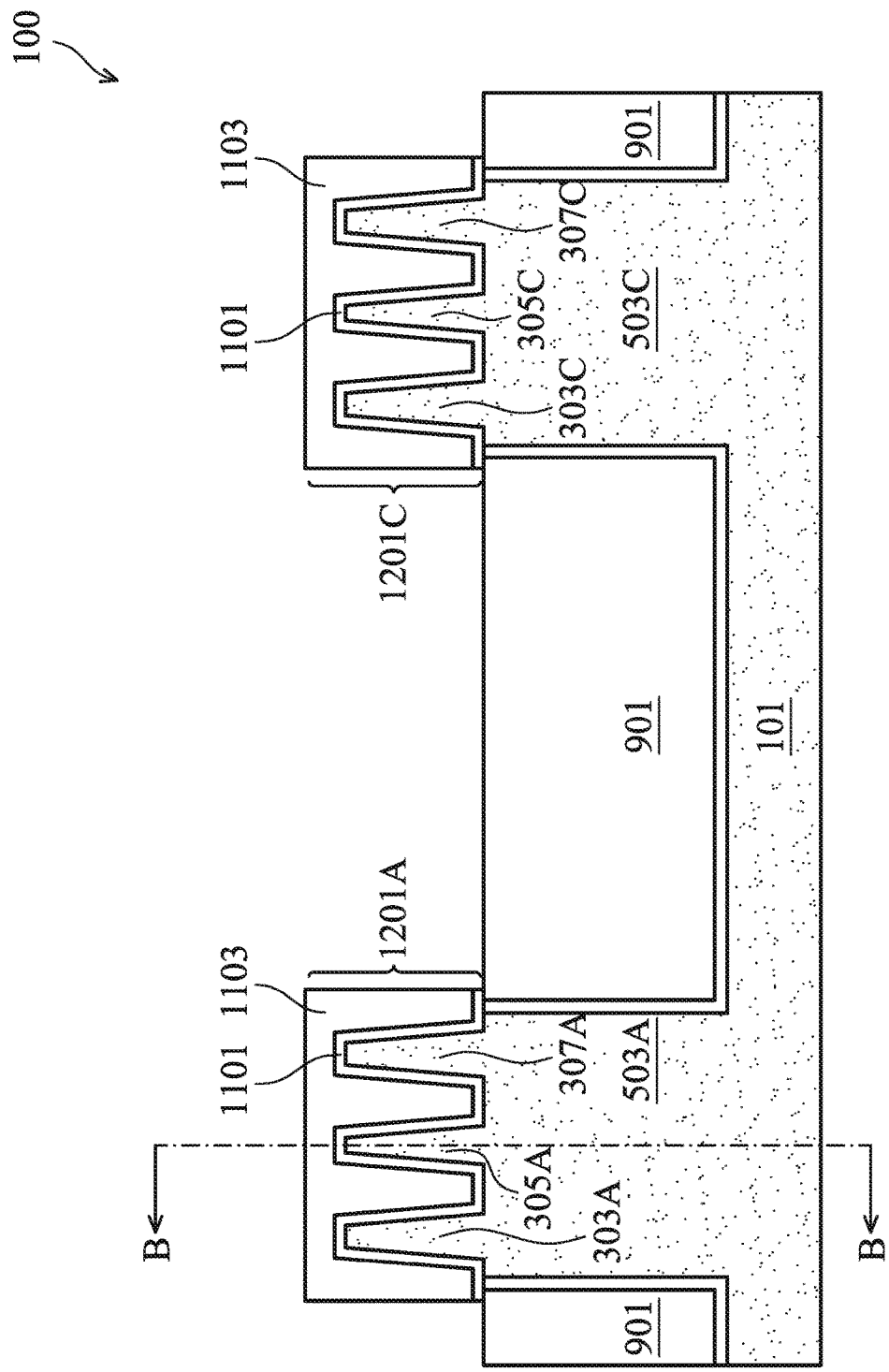
Figure 12B:
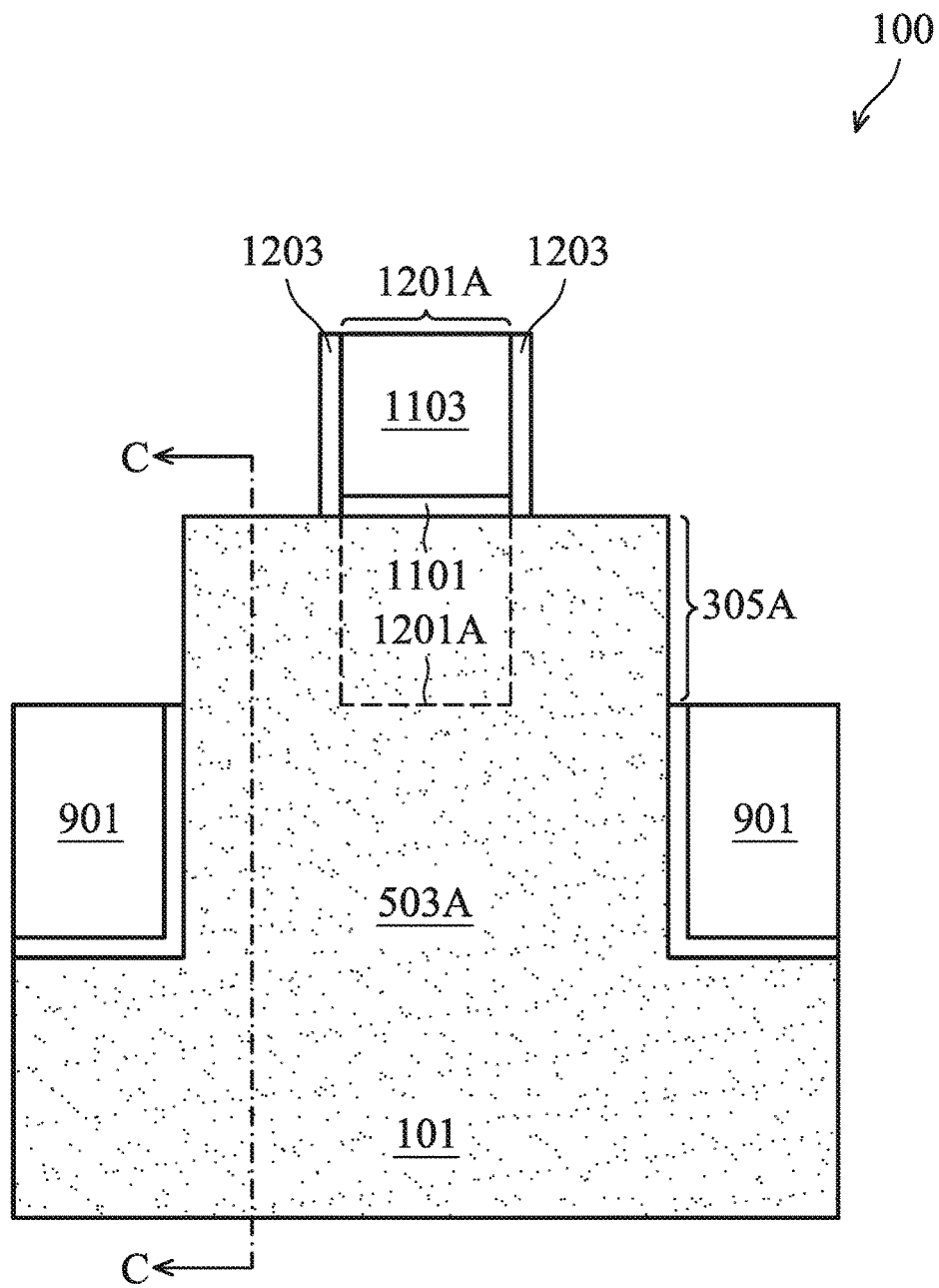
Figure 12C:
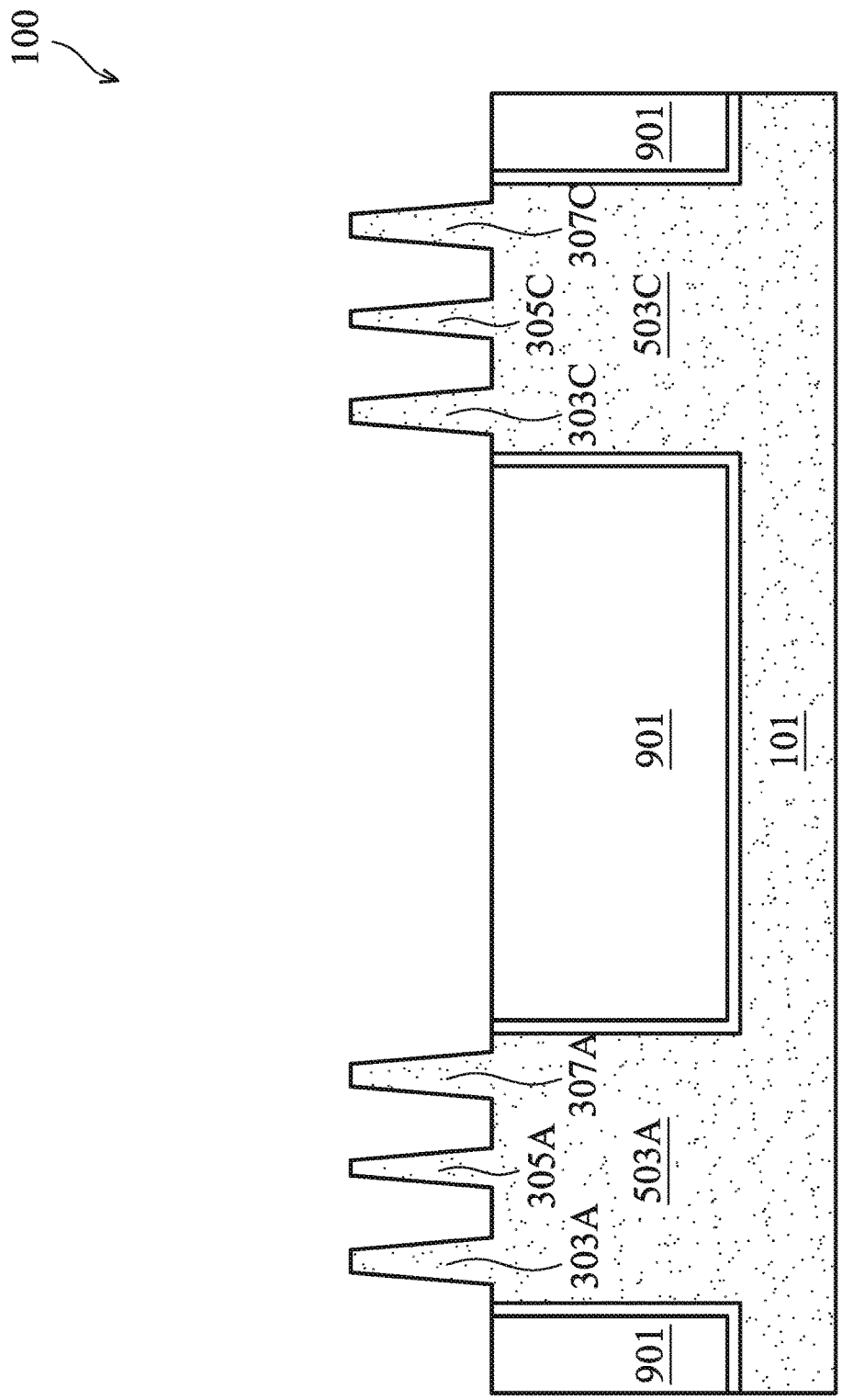

Referring to FIGS. 12A, 12B and 12C, the dummy gate dielectric 1101 and the dummy gate electrode 1103 are patterned to form dummy gate stacks 1201A and 1201C over the active fins 303A, 305A and 307A and the active fins 303C, 305C and 307C, respectively. FIG. 12B illustrates a cross-sectional view obtained from a vertical plane containing a line B-B in FIG. 12A, and FIG. 12C illustrates a cross-sectional view obtained from a vertical plane containing a line C-C in FIG. 12B. The dummy gate stacks 1201A and 1201C are not shown in FIG. 12C, since the dummy gate stacks 1201A and 1201C are not in the illustrated plane of FIG. 12C. In some embodiments, the dummy gate electrode 1103 and the dummy gate dielectric 1101 may be patterned using suitable lithography and etching processes. As illustrated in FIGS. 12A, 12B and 12C, the dummy gate stack 1201A is formed on sidewalls and top surfaces of middle portions of the active fins 303A, 305A and 307A, such that end portions of the active fins 303A, 305A and 307A are exposed. Similarly, the dummy gate stack 1201C is formed on sidewalls and top surfaces of middle portions of the active fins 303C, 305C and 307C, such that end portions of the active fins 303C, 305C and 307C are exposed.

Referring further to FIGS. 12A, 12B and 12C, gate spacers 1203 are formed on sidewalls of the dummy gate stacks 1201A and 1201C. The gate spacers 1203 may comprise an oxide (such a silicon oxide, aluminum oxide, titanium oxide, or the like), a nitride (such as silicon nitride, titanium nitride, or the like), an oxynitride (such as silicon oxynitride, or the like), an oxycarbide (such as silicon oxycarbide, or the like), a carbonitride (such as silicon carbonitride, or the like), the like, or a combination thereof. In some embodiments, a gate spacer layer may be formed on top surfaces and sidewalls of the dummy gate stacks 1201A and 1201C using CVD, PECVD, ALD, the like, or a combination thereof. Subsequently, the gate spacer layer is patterned using, for example, an anisotropic dry etch process to remove horizontal portions of the spacer layer from the top surfaces of the dummy gate stacks 1201A and 1201C. Portions of the gate spacer layer remaining on the sidewalls of the dummy gate stacks 1201A and 1201C form the gate spacers 1203.

Figure 13A:
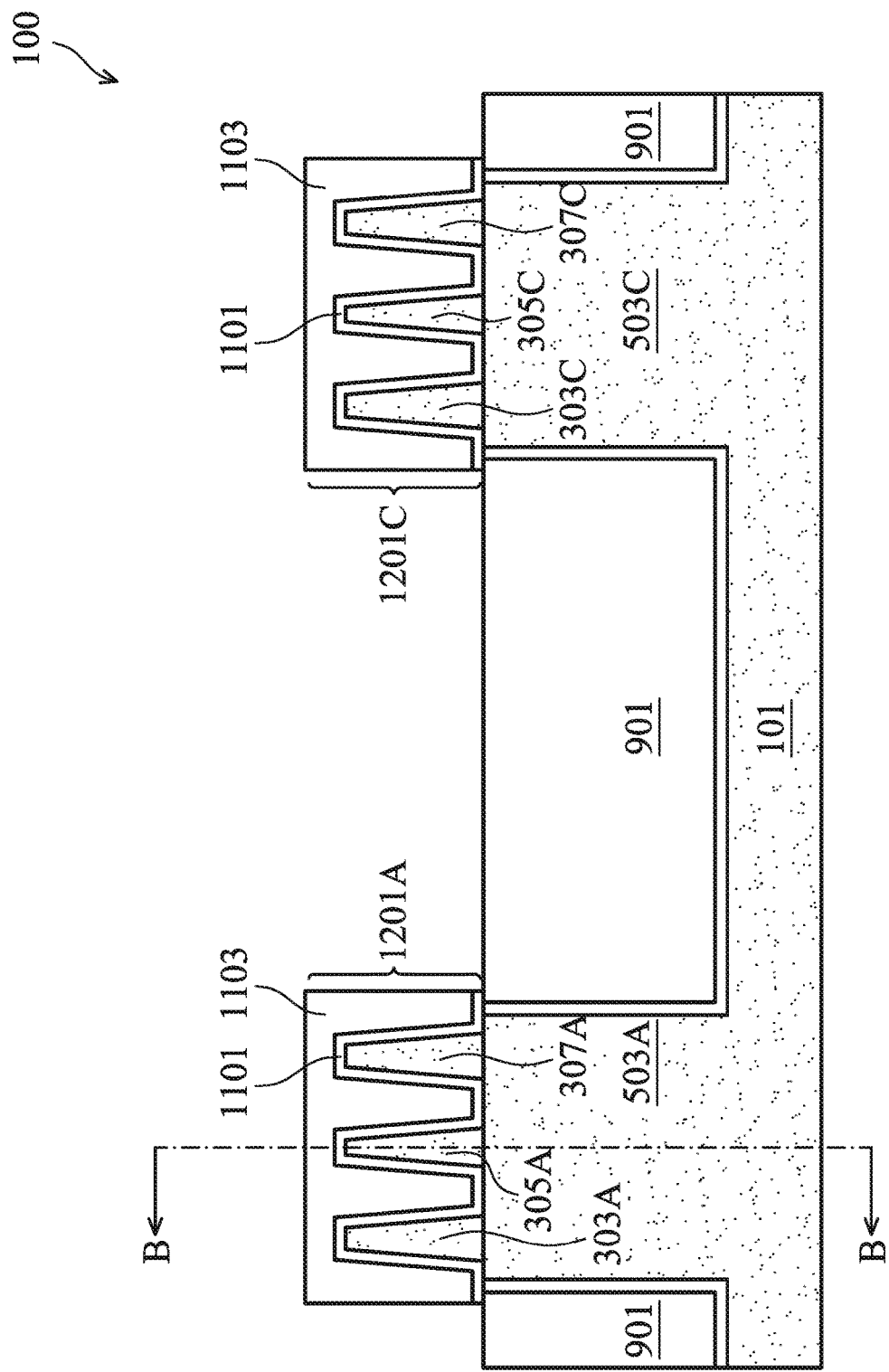
Figure 13B:
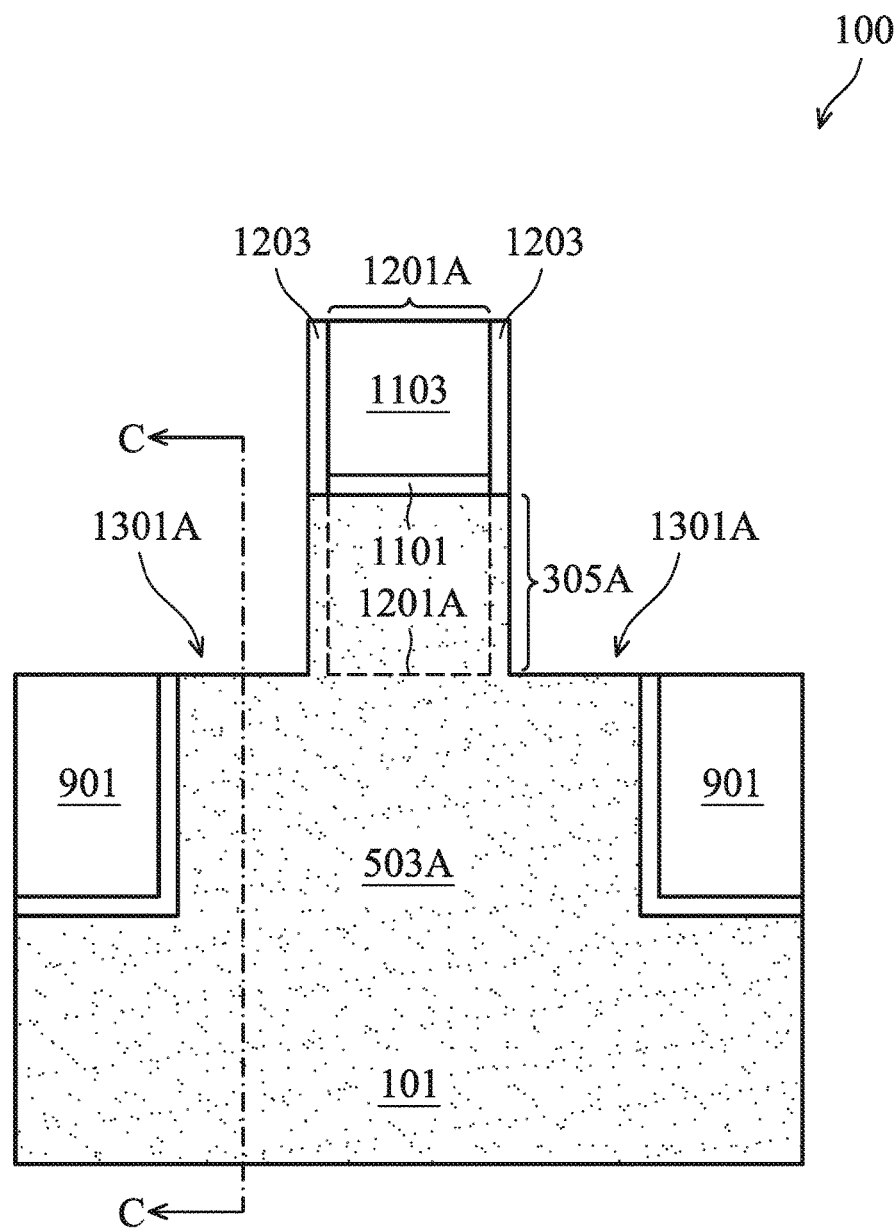
Figure 13C:
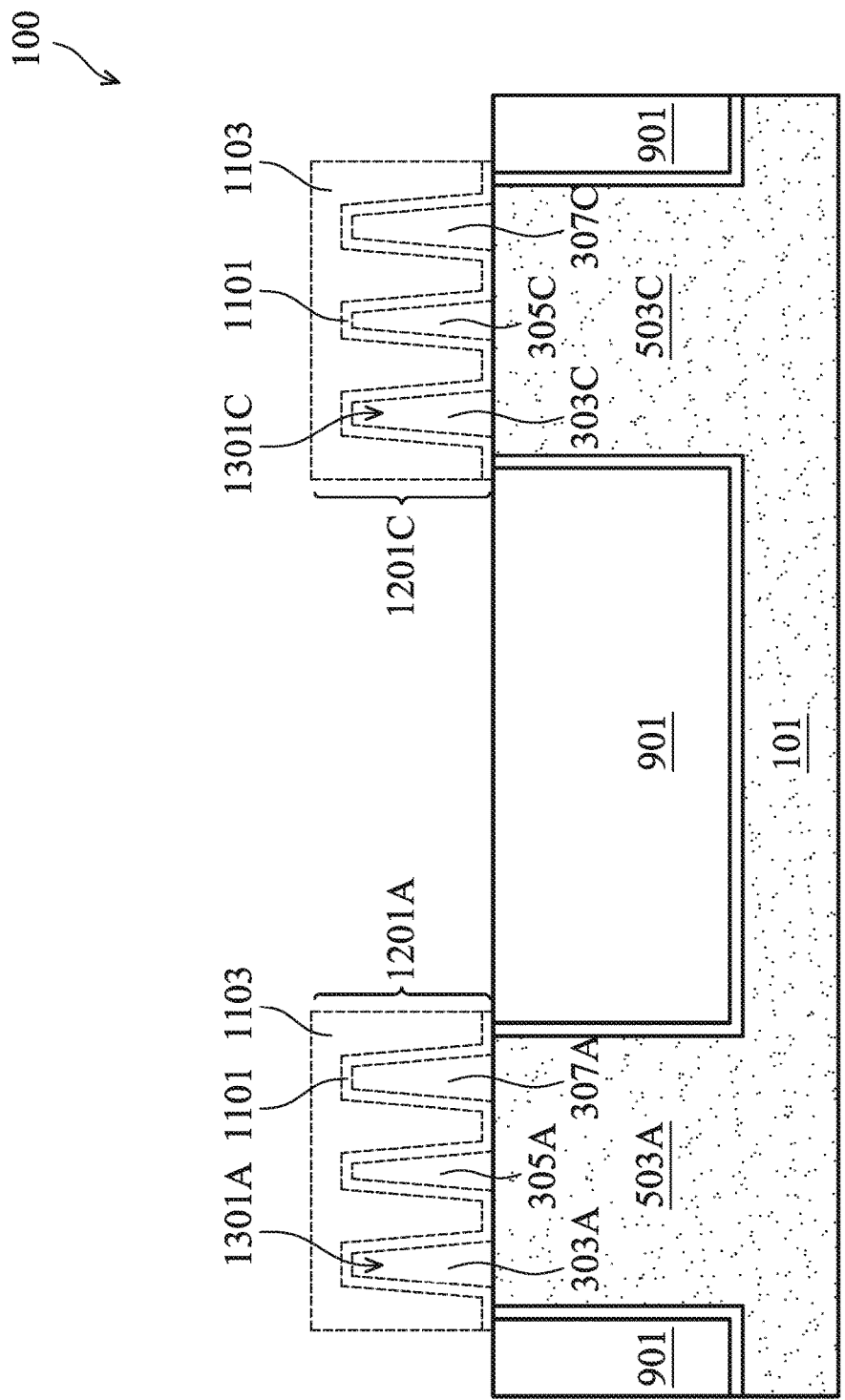

Referring to FIGS. 13A, 13B and 13C, the exposed end portions of the active fins 303A, 305A, 307A, 303C, 305C and 307C are removed. FIG. 13B illustrates a cross-sectional view obtained from a vertical plane containing a line B-B in FIG. 13A, and FIG. 13C illustrates a cross-sectional view obtained from a vertical plane containing a line C-C in FIG. 13B. Since the dummy gate stacks 1201A and 1201C, and the unremoved portions of the active fins 303A, 305A, 307A, 303C, 305C and 307C are not in the cross-section plane of FIG. 13C, they are shown with dashed lines in FIG. 13C. In some embodiments, the exposed end portions of the active fins 303A, 305A and 307A and the exposed end portions of the active fins 303C, 305C and 307C are removed by a suitable etching process using the dummy gate stacks 1201A and 1201C, respectively, as etch masks. After the etching process, the portions of the active fins 303A, 305A and 307A and the portions of the active fins 303C, 305C and 307C directly underling the dummy gate stacks 1201A and 1201C, respectively, remain unremoved. The unremoved portions of the active fins 303A, 305A, 307A, 303C, 305C and 307C form channel regions of the resulting FinFETs. In some embodiments, the exposed end portions of the active fins 303A, 305A, 307A, 303C, 305C and 307C may be removed by etching using any acceptable etch process, such as a RIE, neutral beam etch (NBE), tetramethylammonium hydroxide (TMAH), ammonium hydroxide (NH$_4$OH), the like, or a combination thereof. In the illustrated embodiments, recesses 1301A and 1301C formed after removing the exposed end portions of the active fins 303A, 305A and 307A and the active fins 303C, 305C and 307C, respectively, have bottoms substantially level with the top surfaces of the adjacent STI regions 901. In other embodiments, the bottoms of the recesses 1301A and 1301C may be below the top surfaces of the adjacent STI regions 901.

Figure 14A:
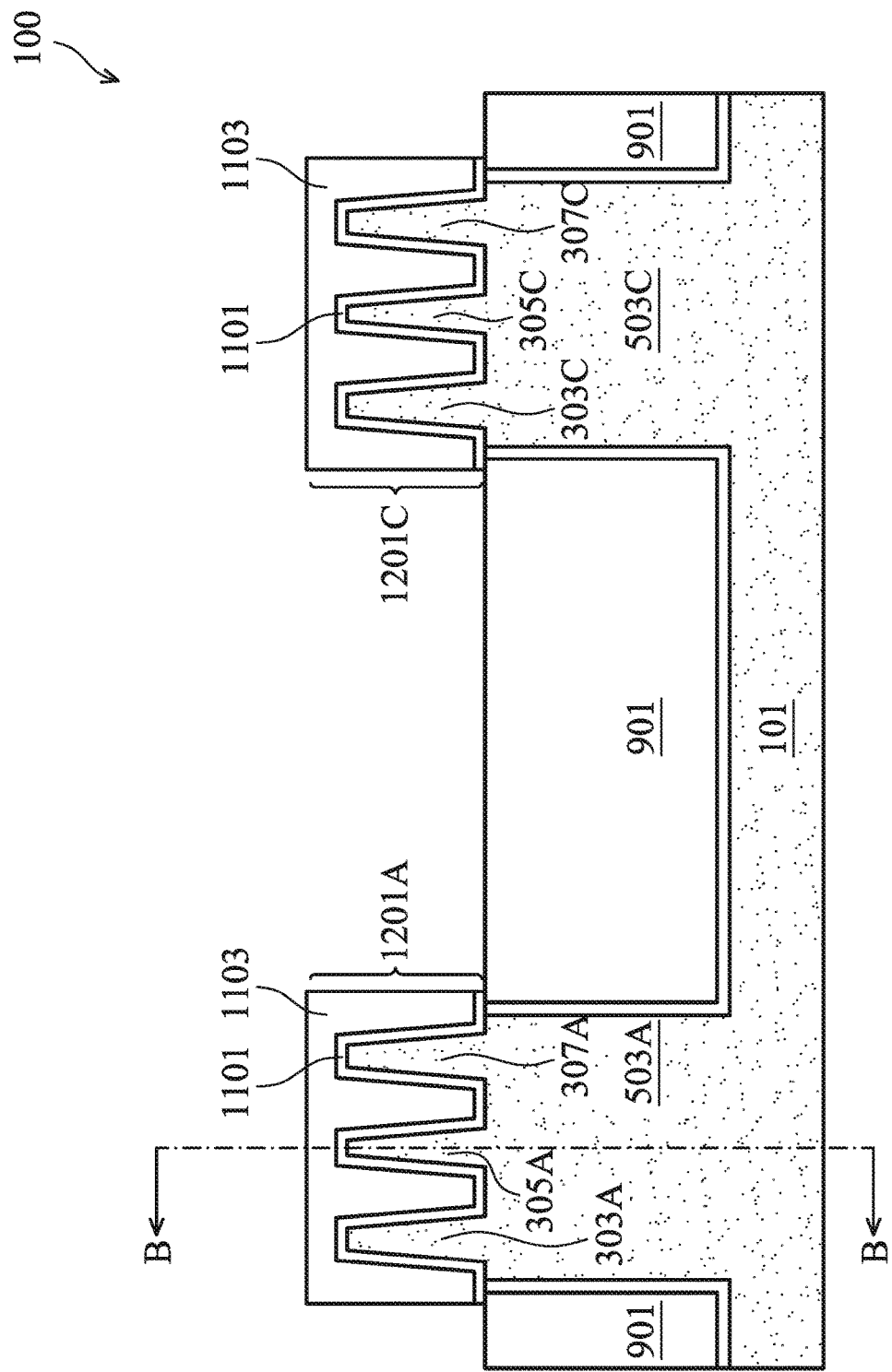
Figure 14B:
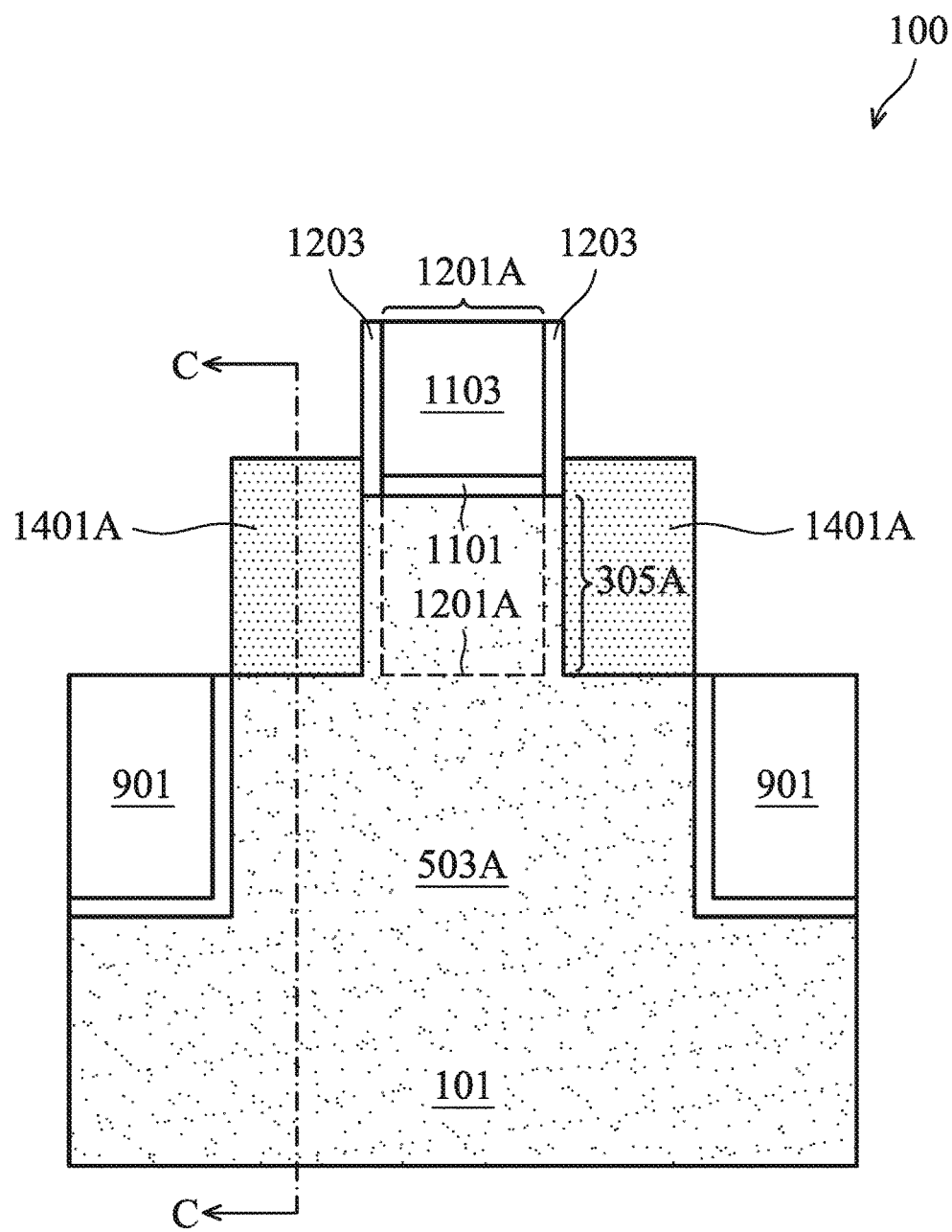

Referring to FIGS. 14A, 14B and 14C, source/drain regions 1401A and 1401C are formed in the recesses 1301A and 1301C (see FIGS. 13A, 13B and 13C), respectively. FIG. 14B illustrates a cross-sectional view obtained from a vertical plane containing a line B-B in FIG. 14A, and FIG. 14C illustrates a cross-sectional view obtained from a vertical plane containing a line C-C in FIG. 14B. The source/drain regions 1401A and 1401C are formed in the recesses 1301A and 1301C, respectively, by epitaxially growing a material in the recesses 1301A and 1301C, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIG. 14C, the source/drain region 1401A is a common continuous source/drain region for the active fins 303A, 305A and 307A, and the source/drain region 1401C is a common continuous source/drain region for the active fins 303C, 305C and 307C. The source/drain regions 1401A and 1401C may have upward facing facets and downward facing facets in accordance with some embodiments, or may have other shapes.

In some embodiments in which the resulting FinFETs are n-type FinFETs, the source/drain regions 1401A and 1401C comprise silicon carbide (SiC), silicon phosphorous (SiP), phosphorous-doped silicon carbon (SiCP), or the like. In some embodiments in which the resulting FinFETs are p-type FinFETs, the source/drain regions 1401A and 1401C comprise SiGe, and a p-type impurity such as boron or indium. In some embodiments in which the resulting FinFETs are both n-type FinFETs and p-type FinFETs, the source/drain region 1401A may comprise silicon carbide (SiC), silicon phosphorous (SiP), phosphorous-doped silicon carbon (SiCP), or the like, and the source/drain region 1401C may comprise SiGe, and a p-type impurity such as boron or indium. In some embodiments, the source/drain regions 1401A and 1401C may be implanted with suitable dopants followed by an anneal. The implanting process may include forming and patterning masks such as a photoresist to cover the regions of the FinFET that are to be protected from the implanting process. In other embodiments, the source/drain regions 1401A and 1401C may be in situ doped during the epitaxial growth process.

Figure 15A:
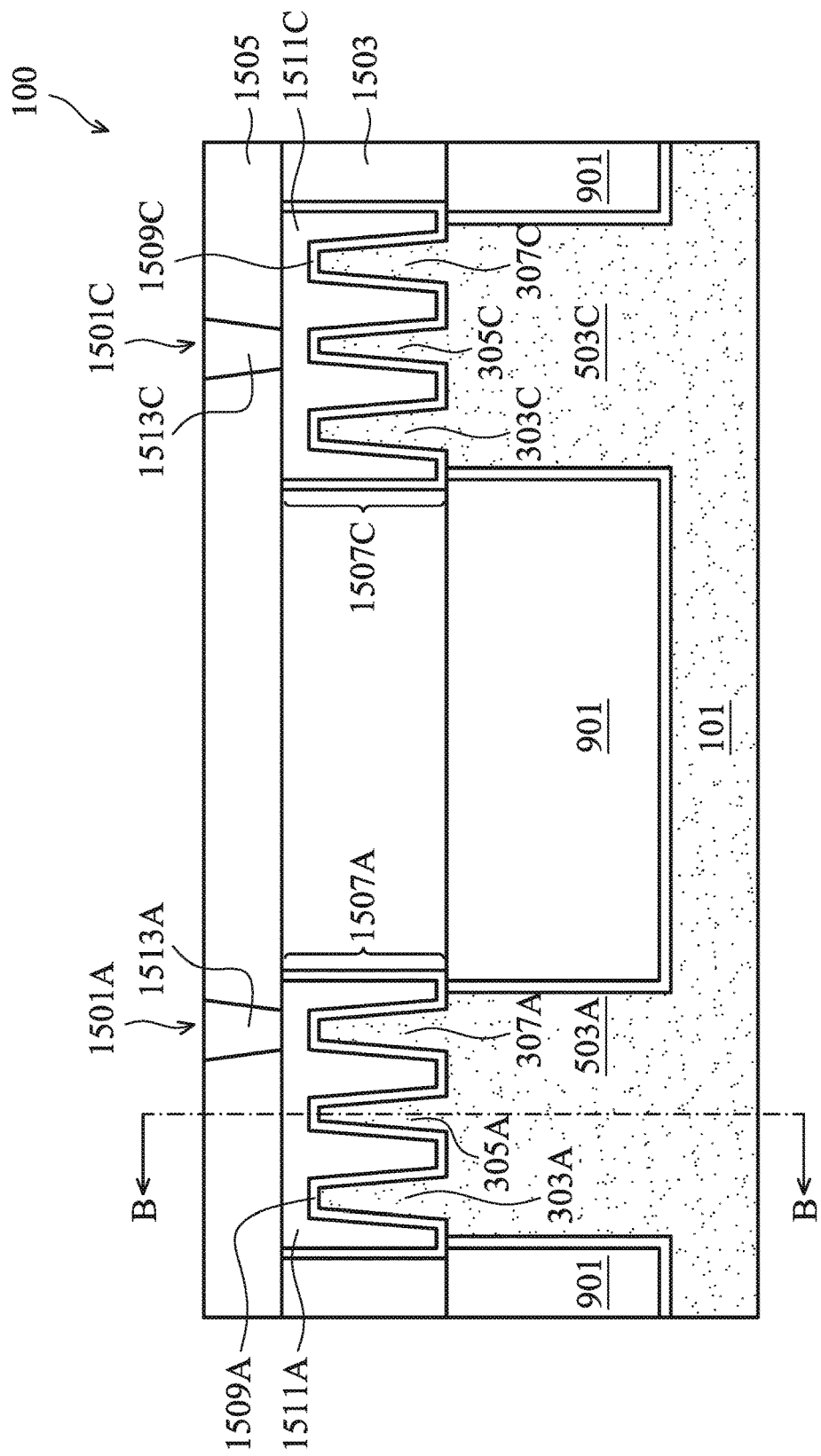
Figure 15B:
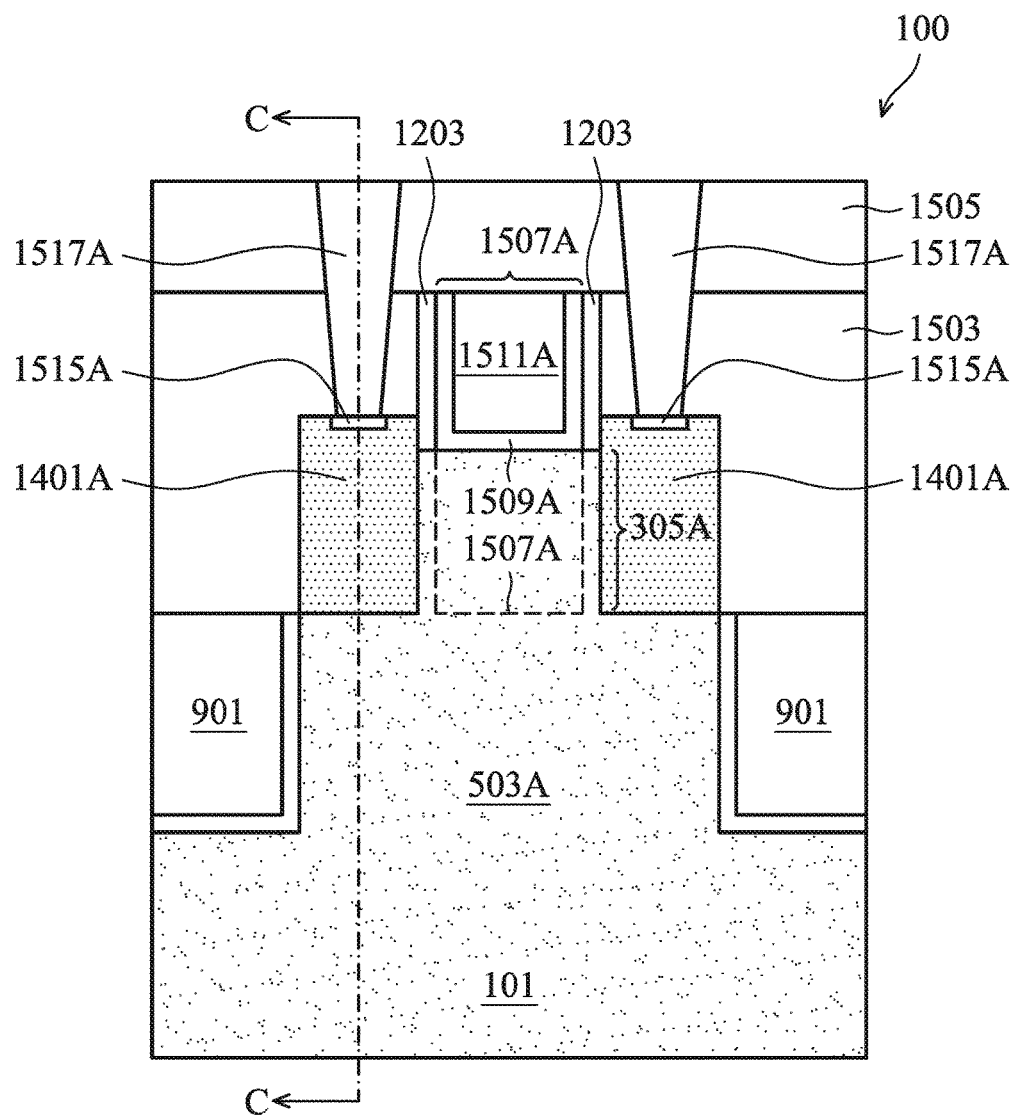
Figure 15C:
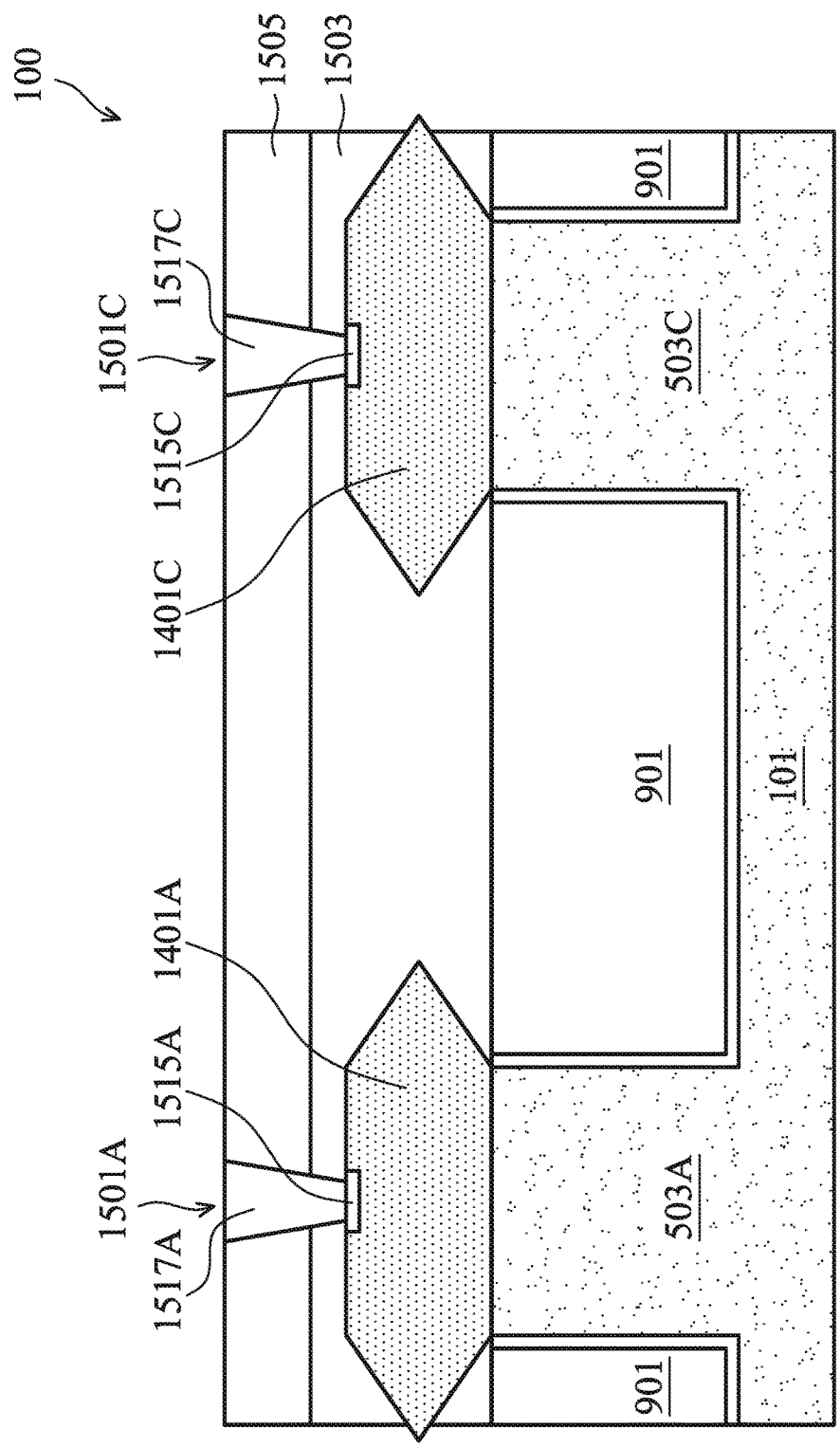

Referring to FIGS. 15A, 15B and 15C, a plurality of process steps is performed to complete the formation of FinFETs 1501A and 1501C. FIG. 15B illustrates a cross-sectional view obtained from a vertical plane containing a line B-B in FIG. 15A, and FIG. 15C illustrates a cross-sectional view obtained from a vertical plane containing a line C-C in FIG. 15B. In some embodiments, the dummy gate stacks 1201A and 1201C (see FIGS. 14A, 14B and 14C) are replaced with replacement gate stacks 1507A and 1507C, respectively. In some embodiments, the formation of the replacement gate stacks 1507A and 1507C may include deposition of a first interlayer dielectric (ILD) 1503 over the dummy gate stacks 1201A and 1201C, planarization of the first ILD 1503 by, for example, a CMP process until top surfaces of the dummy gate stacks 1201A and 1201C are exposed, and removal of the dummy gate stacks 1201A and 1201C by, for example, a suitable etching process to form recesses in the first ILD 1503. Subsequently, the gate dielectrics 1509A and 1509C are formed in the respective recesses, and the gate electrodes 1511A and 1511C are formed over the gate dielectrics 1509A and 1509C, respectively. In some embodiments, excess material overfilling the recesses in the first ILD 1503 may be removed by, for example, a CMP process. In such embodiments, the top surface of the first ILD 1503 is substantially coplanar with top surfaces of the replacement gate stacks 1507A and 1507C.

The first ILD 1503 may be formed of a dielectric material such as phosphosilicate glass (PSG), borosilicate glass (BSG), boron-doped phosphosilicate Glass (BPSG), undoped silicate glass (USG), the like, or a combination thereof and may be deposited by any suitable method, such as CVD, PECVD, FCVD, the like, or a combination thereof. In some embodiments, the gate dielectrics 1509A and 1509C may comprise a dielectric material such as, for example, silicon oxide, silicon nitride, multilayers thereof, or the like, and may be deposited or thermally grown according to acceptable techniques. In other embodiments, the gate dielectrics 1509A and 1509C may comprise a high-k dielectric material such as, for example, a metal oxide or a silicate of Hf, Al, Zr, La, Mg, Ba, Ti, Pb, the like, multilayers thereof, and combinations thereof, and may be formed by, for example, molecular-beam deposition (MBD), ALD, PECVD, the like, or a combination thereof. In some embodiments, the gate dielectric 1509A and the gate dielectric 1509C comprise a same dielectric material. In other embodiments, the gate dielectric 1509A and the gate dielectric 1509C comprise different dielectric materials. The gate electrodes 1511A and 1511C may comprise a metallic material such as gold, silver, aluminum, copper, tungsten, molybdenum, nickel, titanium, or alloys thereof, and may be formed using physical vapor deposition (PVD), ALD, plating, the like, or a combination thereof. In some embodiments, the gate electrode 1511A and the gate electrode 1511C comprise a same conductive material. In other embodiments, the gate electrode 1511A and the gate electrode 1511C comprise different conductive materials.

Referring further to FIGS. 15A, 15B and 15C, a second ILD 1505 is formed over the first ILD 1503 and the replacement gate stacks 1507A and 1507C. The second ILD 1505 may be formed using similar materials and methods as the first ILD 1503 and the description is not repeated herein for the sake of brevity. In some embodiments, the first ILD 1503 and the second ILD 1505 may comprise a same dielectric material, such that an interface between the first ILD 1503 and the second ILD 1505 may not be distinguishable. In other embodiments, the first ILD 1503 and the second ILD 1505 may comprise different dielectric materials.

In some embodiments, gate contacts 1513A and 1513C, and source/drain contacts 1517A and 1517C are formed in the first ILD 1503 and the second ILD 1505. The gate contacts 1513A and 1513C are physically and electrically coupled to the replacement gate stacks 1507A and 1507C, respectively. The source/drain contacts 1517A and 1517C are physically and electrically coupled to the source/drain regions 1401A and 1401C, respectively. In some embodiments, openings for the gate contacts 1513A and 1513C and the source/drain contacts 1517A and 1517C are formed through the first ILD 1503 and the second ILD 1505. The openings may be formed using suitable photolithography and etching techniques. A liner (not shown), such as a diffusion barrier layer, an adhesion layer, or the like, and a conductive material are formed in the openings. The liner may include titanium, titanium nitride, tantalum, tantalum nitride, the like, or a combination thereof. The conductive material may be copper, a copper alloy, silver, gold, tungsten, aluminum, nickel, the like, or a combination thereof. A planarization process, such as a CMP process, may be performed to remove excess materials from a top surface of the second ILD 1505. The remaining liner and conductive material form the gate contacts 1513A and 1513C and the source/drain contacts 1517A and 1517C in the respective openings. An anneal process may be performed to form silicides 1515A and 1515C at interfaces between the source/drain regions 1401A and 1401C and the source/drain contacts 1517A and 1517C, respectively. Although not explicitly shown, a person having ordinary skill in the art will readily understand that further processing steps may be performed on the structure in FIGS. 15A, 15B and 15C. For example, various inter-metal dielectrics (IMD) and their corresponding metallizations may be formed over the second ILD 1505. In an embodiment, the group of active fins 303A, 305A and 307A, and the group of active fins 303C, 305C and 307C have a structure such as illustrated in FIG. 3B. In another embodiment, the group of active fins 303A, 305A and 307A, and the group of active fins 303C, 305C and 307C have a structure such as illustrated in FIG. 10B. In yet another embodiment, the group of active fins 303A, 305A and 307A, and the group of active fins 303C, 305C and 307C have a structure such as illustrated in FIG. 10C.

Figure 16A:
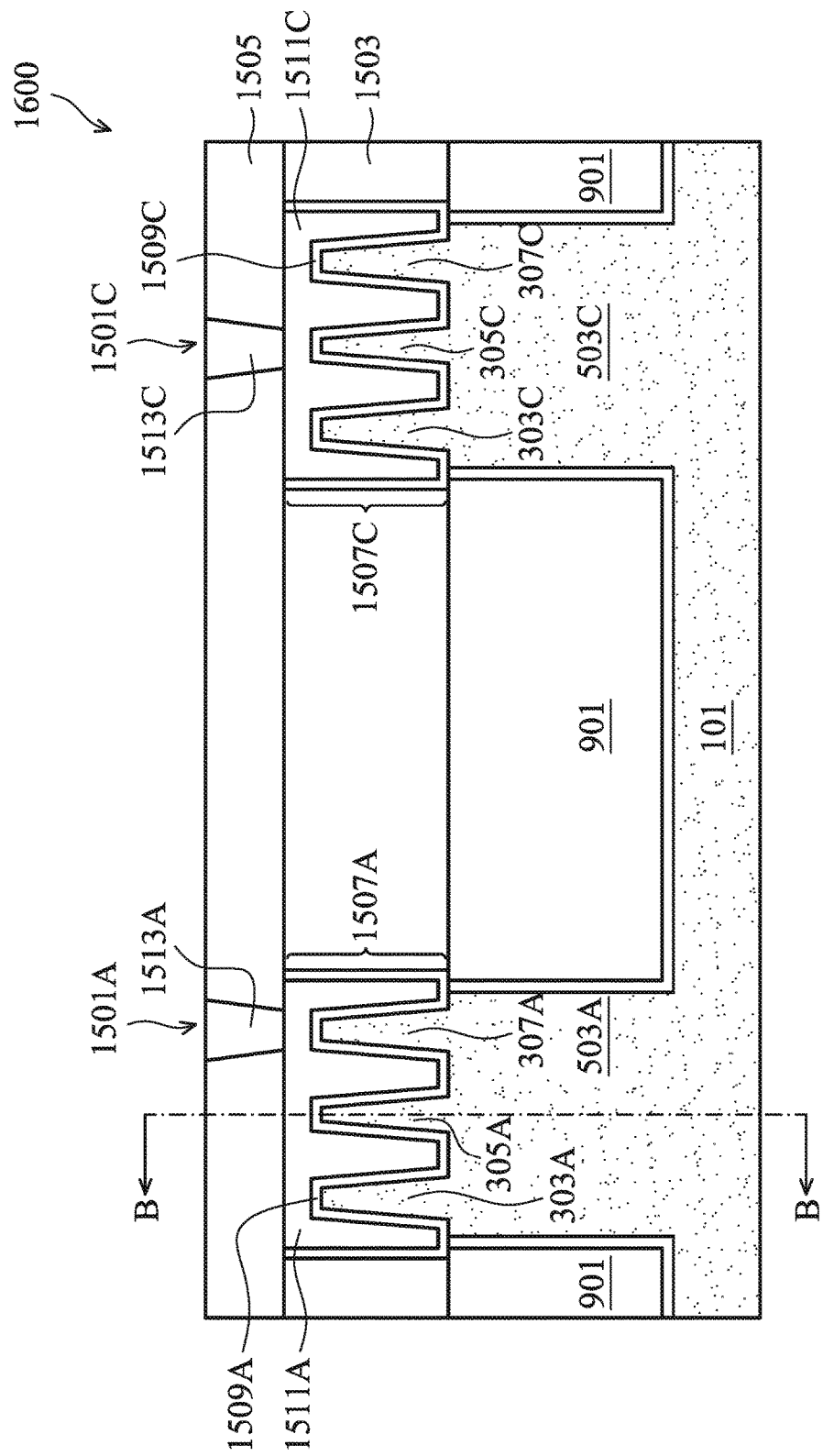
FIGS. 16A, 16B, and 16C illustrate cross-sectional views of a semiconductor device in accordance with some embodiments.
Figure 16B:
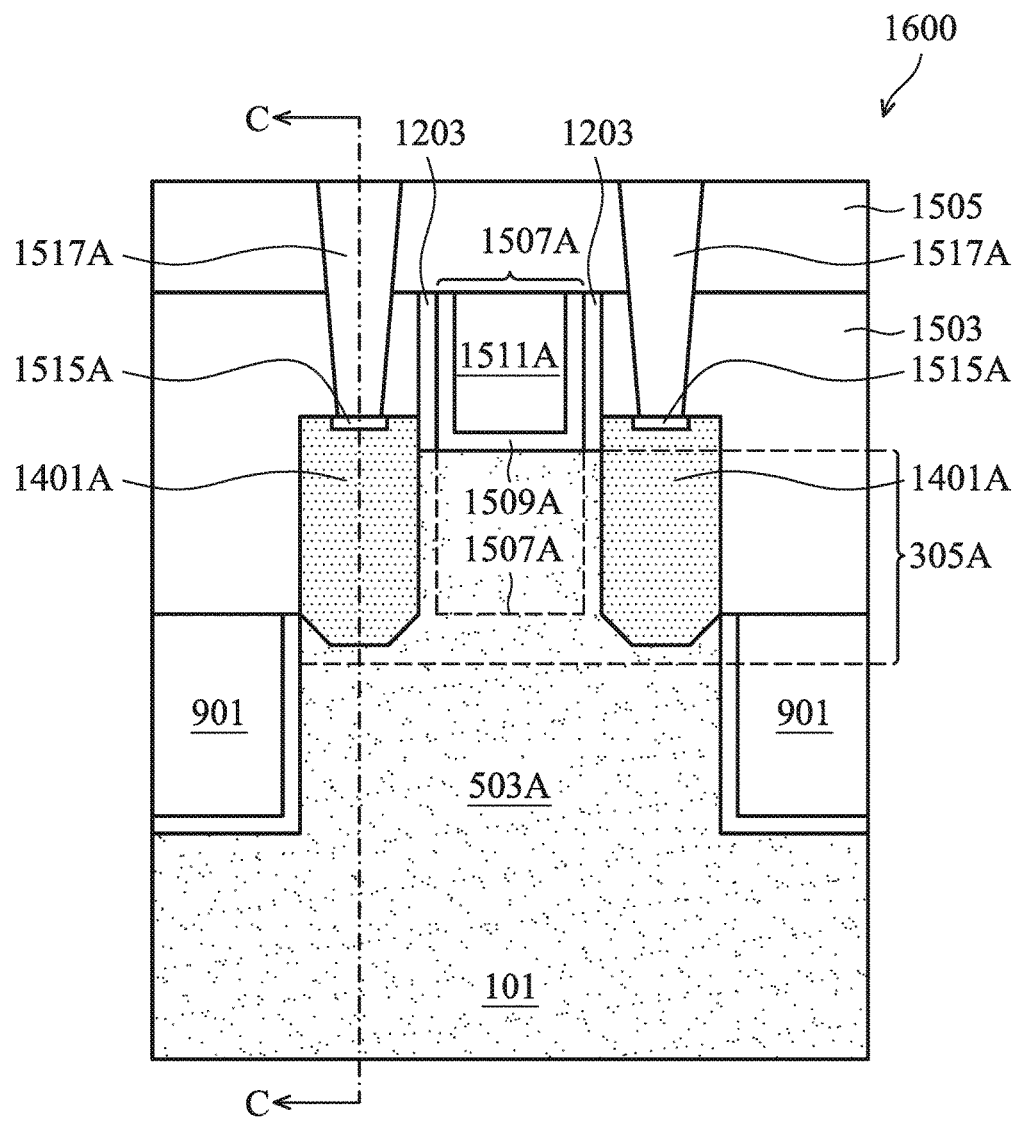
Figure 16C:
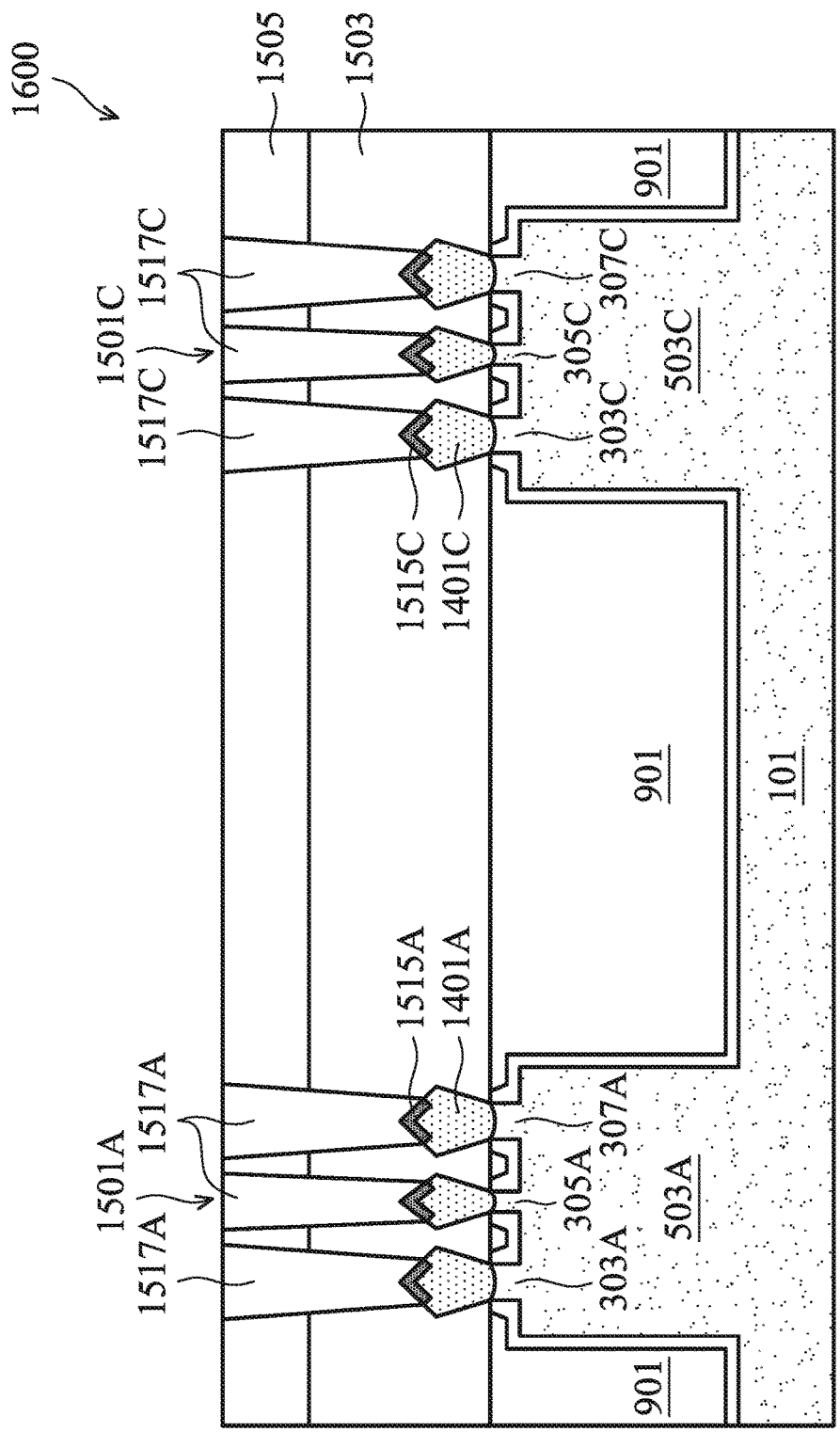

FIGS. 16A, 16B, and 16C illustrate cross-sectional views of a semiconductor device 1600 in accordance with some embodiments. FIG. 16B illustrates a cross-sectional view obtained from a vertical plane containing a line B-B in FIG. 16A, and FIG. 16C illustrates a cross-sectional view obtained from a vertical plane containing a line C-C in FIG. 16B. The semiconductor device 1600 is similar to the semiconductor device 100 (see FIGS. 15A, 15B, and 15C), with like elements labeled with like numerical references. In some embodiments, the semiconductor device 1600 may be formed using similar materials and methods as the semiconductor device 100, described above with reference to FIGS. 1-15C, and the description is not repeated herein for the sake of brevity. In the illustrated embodiment, the source/drain regions 1401A and 1401C are individual source/drain regions for each of the active fins 303A, 305A and 307A, and for each of the active fins 303C, 305C and 307C, respectively. Accordingly, the source/drain regions 1401A and 1401C do not form common source/drain regions for the group of active fins 303A, 305A and 307A, and the group of active fins 303C, 305C and 307C, respectively.

Figure 17:
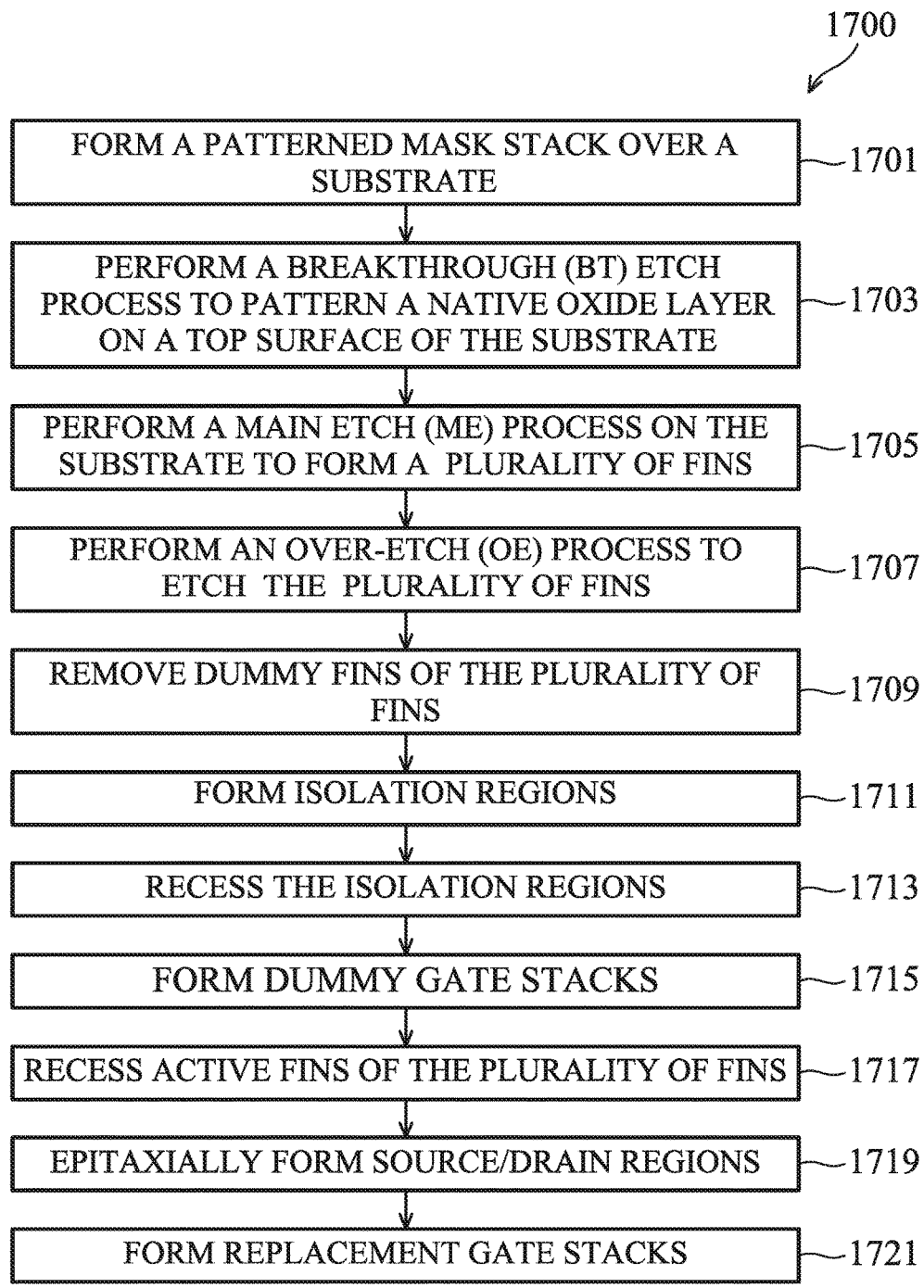
FIG. 17 is a flow diagram illustrating a method of forming a semiconductor device in accordance with some embodiments.

FIG. 17 is a flow diagram illustrating a method 1700 of forming a semiconductor device in accordance with some embodiments. The method 1700 starts with step 1701, where a patterned mask stack (such as the mask stack 107 illustrated in FIG. 2) is formed over a substrate (such as the substrate 101 illustrated in FIG. 2) as described above with reference to FIGS. 1 and 2. In step 1703, a breakthrough (BT) etch process is performed to pattern a native oxide layer (such as the native oxide layer 109 illustrated in FIG. 1) formed on a top surface of the substrate as described above with reference to FIGS. 3A and 3B. In some embodiments, step 1703 may be omitted. In step 1705, a main etch (ME) process is performed on the substrate to form a plurality of fins (such as the fins 303A, 303B, 303C, 305A, 305B, 305C, 307A, 307B and 307C illustrated in FIGS. 3A and 3B) as described above with reference to FIGS. 3A and 3B. In step 1707, an over-etch (OE) process is performed to etch the plurality of fins and tune various dimensions of the plurality of fins as described above with reference to FIGS. 3A and 3B. In step 1709, an etch processes is performed to remove the dummy fins (such as the dummy fins 303B, 305B and 307B illustrated in FIG. 6) of the plurality of fins as described above with reference to FIGS. 6 and 7. In step 1711, isolation regions (such as the STI regions 901 illustrated in FIG. 9) are formed as described above with reference to FIGS. 8 and 9. In step 1713, the isolation regions are recessed to expose active fins (such as the fins 303A, 303C, 305A, 305C, 307A, and 307C illustrated in FIGS. 10A, 10B, and 10C) of the plurality of fins as described above with reference to FIGS. 10A, 10B, and 10C. In step 1715, dummy gate stacks (such as the dummy gate stacks 1201A and 1201C illustrated in FIGS. 12A, 12B and 12C) are formed over the exposed active fins as described above with reference to FIGS. 11, 12A, 12B and 12C. In step 1717, the active fins are recessed as described above with reference to FIGS. 13A, 13B and 13C. In step 1719, source/drain regions (such as the source/drain regions 1401A and 1401C illustrated in FIGS. 14A, 14B and 14C) are epitaxially formed as described above with reference to FIGS. 14A, 14B and 14C. In step 1721, replacement gate stacks (such as the replacement gate stacks 1507A and 1507C illustrated in FIGS. 15A, 15B and 15C) are formed as described above with reference to FIGS. 15A, 15B and 15C.

The embodiments of the present disclosure have some advantageous features. Various embodiments described herein allow for enlarging a fin loop bending window, source/drain epitaxy uniformity control, large source/drain contact landing window, lower contact resistance, better wafer acceptance test (WAT) and reliability performance, better circuit probe (CP) yield performance, and better ring oscillator (RO) performance. Furthermore, leakage current and impact of random dopant fluctuations (RDF) may be also reduced.

According to an embodiment, a method includes forming a patterned mask stack over a substrate, features of the patterned mask stack protecting the substrate having a uniform width. Unprotected portions of the substrate exposed by the patterned mask stack are removed to form a plurality of recesses in the substrate, unremoved portions of the substrate interposed between adjacent recesses forming a plurality of fins. Portions of the plurality of fins are removed, a width of a first fin of the plurality of fins being less than a width of a second fin of the plurality of fins.

According to another embodiment, a method includes forming a patterned mask stack over a substrate, features of the patterned mask stack protecting the substrate having a uniform width. A first etch process is performed on the substrate using the patterned mask stack as an etch mask, the first etch process forming a plurality of trenches in the substrate, portions of the substrate interposed between adjacent trenches forming a plurality of fins. A second etch process is performed on the plurality of fins using the patterned mask stack as an etch mask to re-shape the plurality of fins, the second etch process being different from the first etch process, a width of a first fin of the plurality of fins being less than a width of a second fin of the plurality of fins after the second etch process.

According to yet another embodiment, a structure includes a substrate, and a first fin extending away from a top surface of the substrate, wherein the first fin has a first height, and wherein a top portion of the first fin has a first width. The structure further includes a second fin extending away from the top surface of the substrate, the second fin being adjacent the first fin, wherein the second fin has a second height, and wherein a top portion of the second fin has a second width, and a third fin extending away from the top surface of the substrate, the third fin being interposed between the first fin and the second fin, wherein the third fin has a third height, wherein a top portion of the third fin has a third width, and wherein the third width is less than the first width and the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a patterned mask stack over a substrate, features of the patterned mask stack protecting the substrate having a uniform width;
    removing unprotected portions of the substrate exposed by the patterned mask stack to form a plurality of recesses in the substrate, unremoved portions of the substrate interposed between adjacent recesses forming a plurality of fins, wherein removing the unprotected portions of the substrate comprises performing a first etch process on the substrate using the patterned mask stack as an etch mask; and
    removing portions of the plurality of fins, a width of a first fin of the plurality of fins being less than a width of a second fin of the plurality of fins, wherein removing the portions of the plurality of fins comprises performing a second etch process on the plurality of fins using the patterned mask stack as an etch mask, and wherein the first etch process is less anisotropic than the second etch process.

2. The method of claim 1, further comprising reducing a height of the first fin and a height of the second fin, wherein the height of the first fin is reduced by a greater amount than the height of the second fin.

3. The method of claim 1, a wherein the first etch process is performed for a first time interval, wherein the second etch process is performed for a second time interval, and wherein the first time interval is different from the second time interval.

4. The method of claim 1, a wherein the first etch process and the second etch process are performed using different etchants.

5. The method of claim 1, further comprising:
    before removing the unprotected portions of the substrate, etching a native oxide layer on a top surface of the substrate while using patterned mask stack as an etch mask.

6. The method of claim 1, wherein a first process gas mixture of the first etch process comprises less amount of chemically inert gases than chemically active gases, and wherein a second process gas mixture of the second etch process comprises greater amount of the chemically inert gases than the chemically active gases.

7. The method of claim 1, wherein a first ratio of a first lateral etch rate over a first vertical etch rate of the first etch process is greater than a second ratio of a second lateral etch rate over a second vertical etch rate of the second etch process.

8. A method comprising:
    forming a patterned mask stack over a substrate, features of the patterned mask stack protecting the substrate having a uniform width;
    performing a first etch process on the substrate using the patterned mask stack as an etch mask, the first etch process forming a plurality of trenches in the substrate, portions of the substrate interposed between adjacent trenches forming a plurality of fins; and
    performing a second etch process on the plurality of fins using the patterned mask stack as an etch mask to re-shape the plurality of fins, the second etch process being different from the first etch process, the first etch process being more isotropic than the second etch process, a width of a first fin of the plurality of fins being less than a width of a second fin of the plurality of fins after the second etch process.

9. The method of claim 8, further comprising reducing a height of the first fin and a height of the second fin, wherein the height of the first fin is reduced by a greater amount than the height of the second fin.

10. The method of claim 9, wherein reducing the height of the first fin and the height of the second fin comprises removing the patterned mask stack.

11. The method of claim 8, wherein the second etch process increases slopes of sidewalls of the plurality of fins.

12. The method of claim 8, wherein a slope of a first sidewall of the second fin is different from a slope of a second sidewall of the second fin.

13. The method of claim 8, wherein the first etch process and the second etch process are performed using different etchants at different temperatures.

14. The method of claim 8, wherein the first etch process and the second etch process are performed using different bias voltages.

15. A structure comprising:
    a substrate;
    a first fin extending away from a top surface of the substrate, wherein the first fin has a first height, and wherein a top portion of the first fin has a first width;
    a second fin extending away from the top surface of the substrate, the second fin being adjacent the first fin, wherein the second fin has a second height, and wherein a top portion of the second fin has a second width; and
    a third fin extending away from the top surface of the substrate, the third fin being interposed between the first fin and the second fin, wherein the third fin has a third height, wherein a top portion of the third fin has a third width, and wherein the third width is less than the first width and the second width.

16. The structure of claim 15, wherein the first height is approximately equal to the second height.

17. The structure of claim 15, wherein the third height is less than the first height and the second height.

18. The structure of claim 15, wherein the first fin has a first sidewall and a second sidewall, wherein the first sidewall is opposite the second sidewall, and wherein a first slope of the first sidewall is different from a second slope of the second sidewall.

19. The structure of claim 15, wherein the third fin has a first sidewall and a second sidewall, wherein the first sidewall is opposite the second sidewall, and wherein a first slope of the first sidewall is approximately same as a second slope of the second sidewall.

20. The structure of claim 15, wherein the first fin has a faceted top surface.

\* \* \* \* \*

UNITED STATES PATENT AND TRADEMARK OFFICE
CERTIFICATE OF CORRECTION

PATENT NO. : 10,032,877 B2
APPLICATION NO. : 15/611531
DATED : July 24, 2018
INVENTOR(S) : Che-Cheng Chang Page 1 of 1

It is certified that error appears in the above-identified patent and that said Letters Patent is hereby corrected as shown below:

In the Claims

In Column 19, Line 49, Claim 3, delete "a".

In Column 19, Line 54, Claim 4, delete "a".

Signed and Sealed this
Eighteenth Day of September, 2018

Andrei Iancu
*Director of the United States Patent and Trademark Office*